(12) United States Patent
Taneda et al.

(10) Patent No.: US 8,730,136 B2
(45) Date of Patent: May 20, 2014

(54) DISPLAY APPARATUS

(71) Applicant: Sony Corporation, Tokyo (JP)

(72) Inventors: Takayuki Taneda, Kanagawa (JP);
Katsuhide Uchino, Kanagawa (JP);
Yukihito Iida, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 13/682,906

(22) Filed: Nov. 21, 2012

(65) Prior Publication Data

US 2013/0076603 A1    Mar. 28, 2013

Related U.S. Application Data

(63) Continuation of application No. 12/385,189, filed on Apr. 1, 2009, now Pat. No. 8,350,972.

(30) Foreign Application Priority Data

Apr. 16, 2008    (JP) ................................. 2008-106456

(51) Int. Cl.
*G09G 3/32*    (2006.01)
(52) U.S. Cl.
USPC .................................. 345/76; 345/78; 345/86
(58) Field of Classification Search
USPC ............. 345/44, 46, 204–215, 76–86, 90–96; 257/40, 59, 72
See application file for complete search history.

(56) References Cited

U.S. PATENT DOCUMENTS

| | | | |
|---|---|---|---|
| 6,489,632 B1 * | 12/2002 | Yamazaki et al. | 257/66 |
| 6,522,079 B1 * | 2/2003 | Yamada | 315/169.3 |
| 6,618,029 B1 * | 9/2003 | Ozawa | 345/82 |
| 7,336,272 B2 | 2/2008 | Okamoto | |
| 2005/0022500 A1 | 2/2005 | Buehler | |
| 2006/0261841 A1 | 11/2006 | Fish | |
| 2007/0268210 A1 | 11/2007 | Uchino et al. | |
| 2009/0135113 A1 | 5/2009 | Taneda et al. | |
| 2009/0213148 A1 | 8/2009 | Takasugi | |

FOREIGN PATENT DOCUMENTS

| | | |
|---|---|---|
| JP | 01-117683 A | 5/1989 |
| JP | 06-132079 A | 5/1994 |
| JP | 2001-005420 A | 1/2001 |
| JP | 2005-032704 A | 2/2005 |
| JP | 2005-099414 A | 4/2005 |
| JP | 2007-504487 T | 3/2007 |
| JP | 2007-310311 | 11/2007 |
| JP | 2009-128870 A | 6/2009 |
| WO | WO-2007/063662 A1 | 6/2007 |

OTHER PUBLICATIONS

Japanese Office Action issued Mar. 16, 2010 for corresponding Japanese Application No. 2008-106456.

* cited by examiner

*Primary Examiner* — Anh Mai
*Assistant Examiner* — Elmito Breval
(74) *Attorney, Agent, or Firm* — Rader, Fishman & Grauer PLLC

(57) ABSTRACT

Disclosed herein is a display apparatus has a pixel array section including: pixel circuits which are each provided with a driving transistor and an electro-optical device and are laid out to form a matrix; and a draw wire provided in each of the pixel circuits to serve as a wire connecting the driving transistor to a power-supply providing line, wherein the resistance of the draw wire is relatively large in the pixel circuit close to a source applying a power-supply voltage to the power-supply providing line.

9 Claims, 16 Drawing Sheets

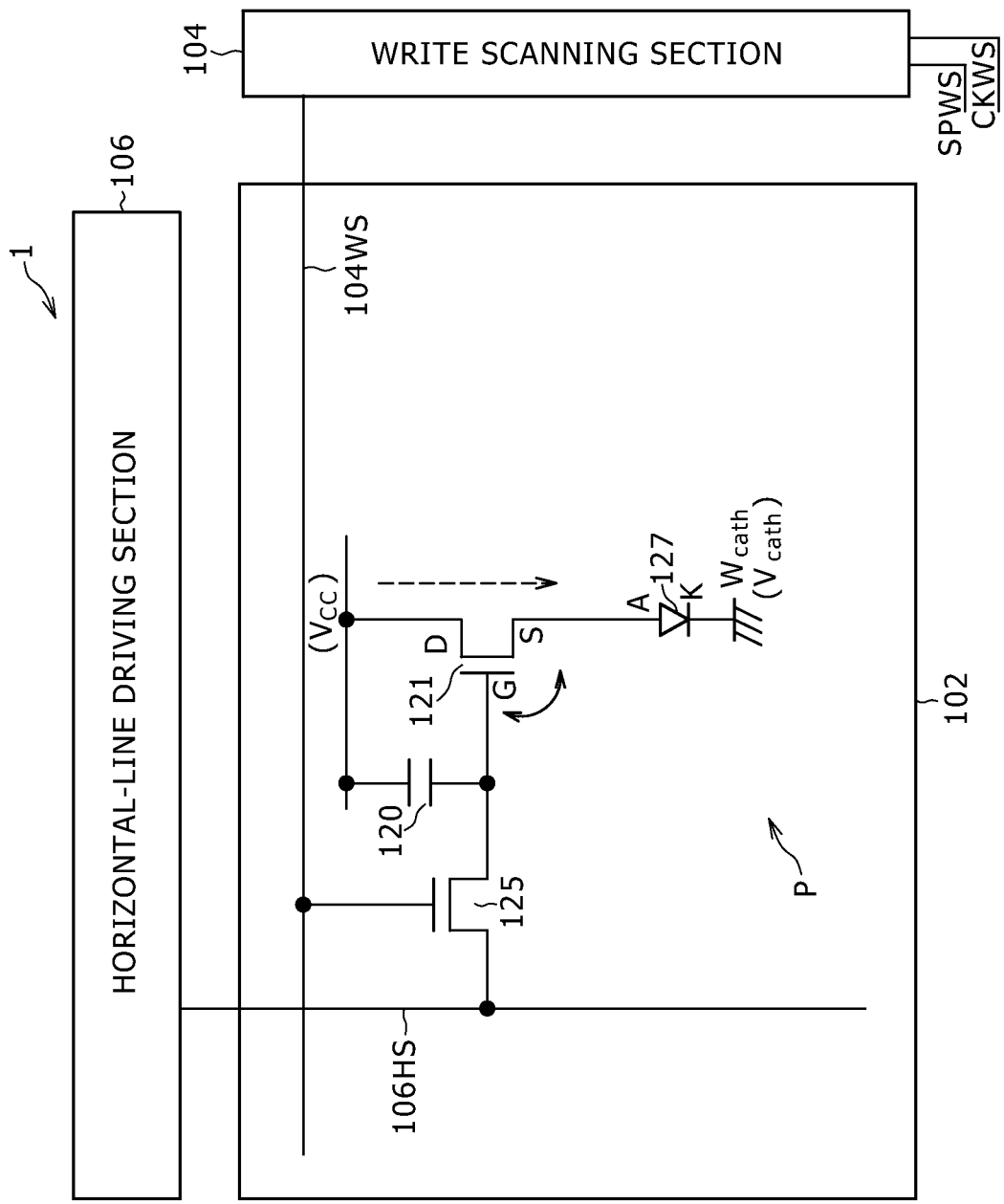

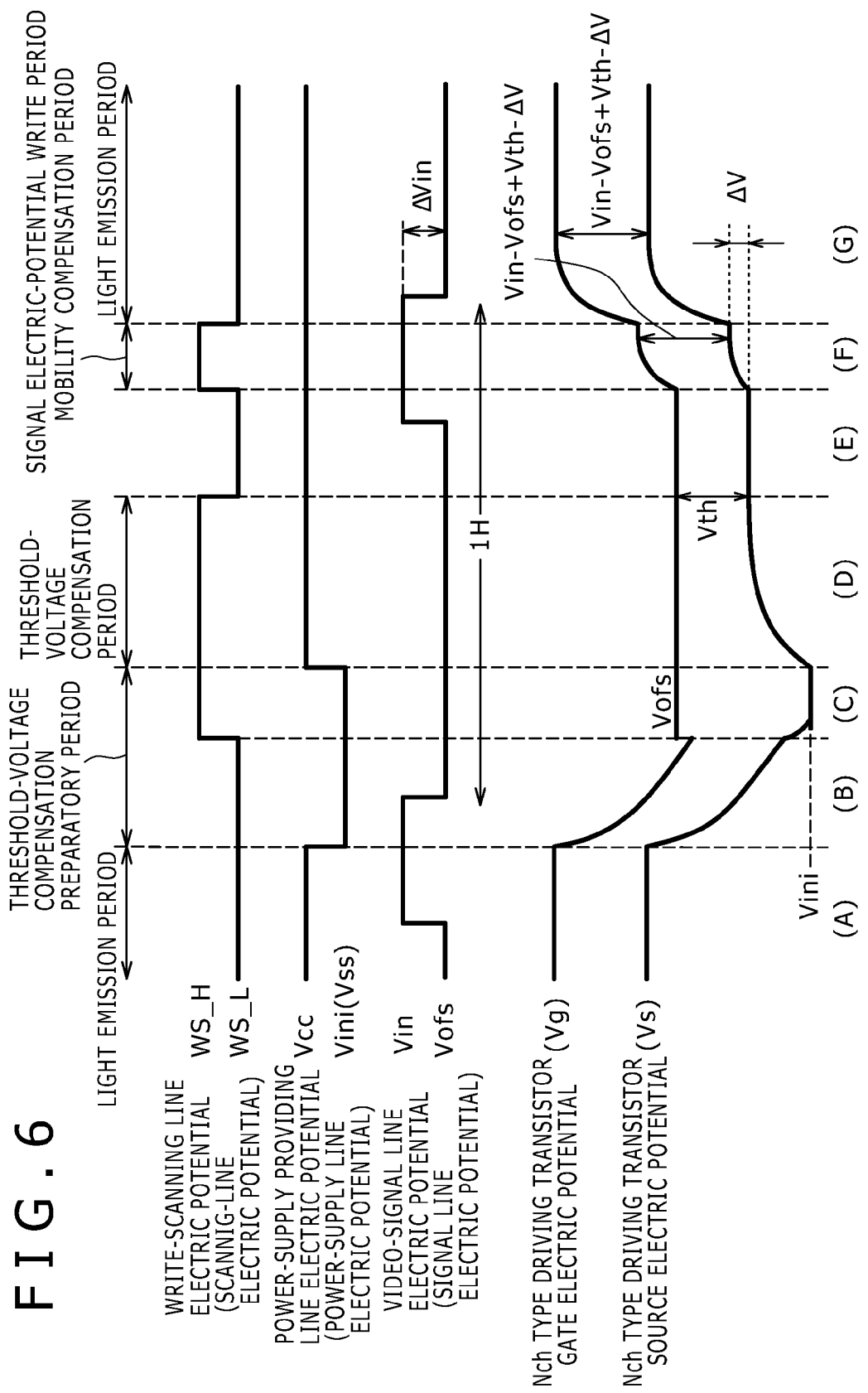

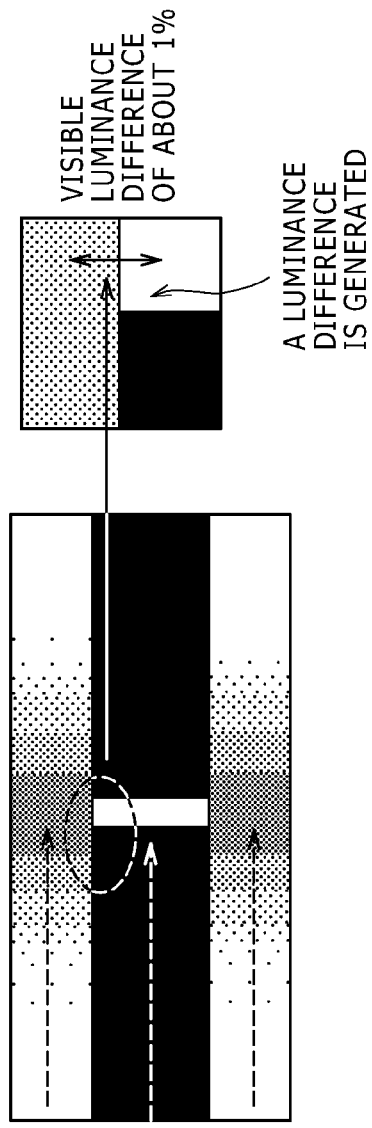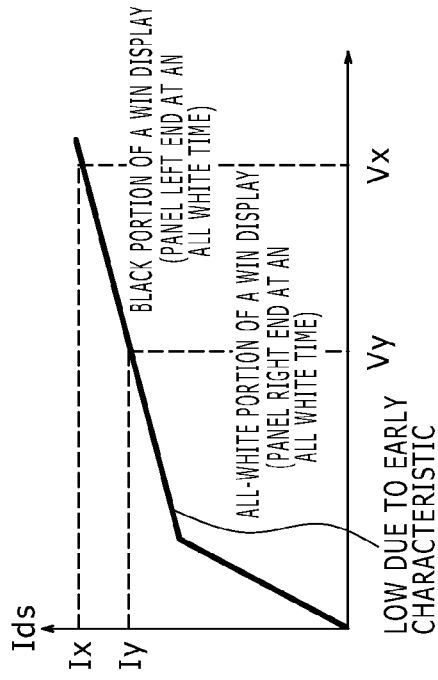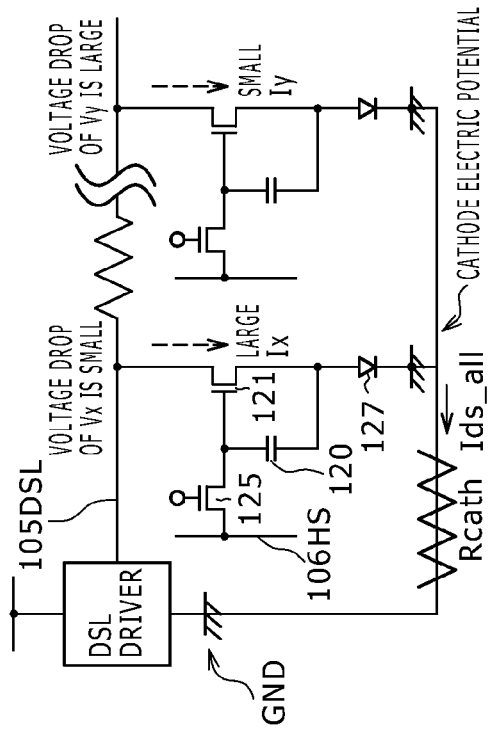

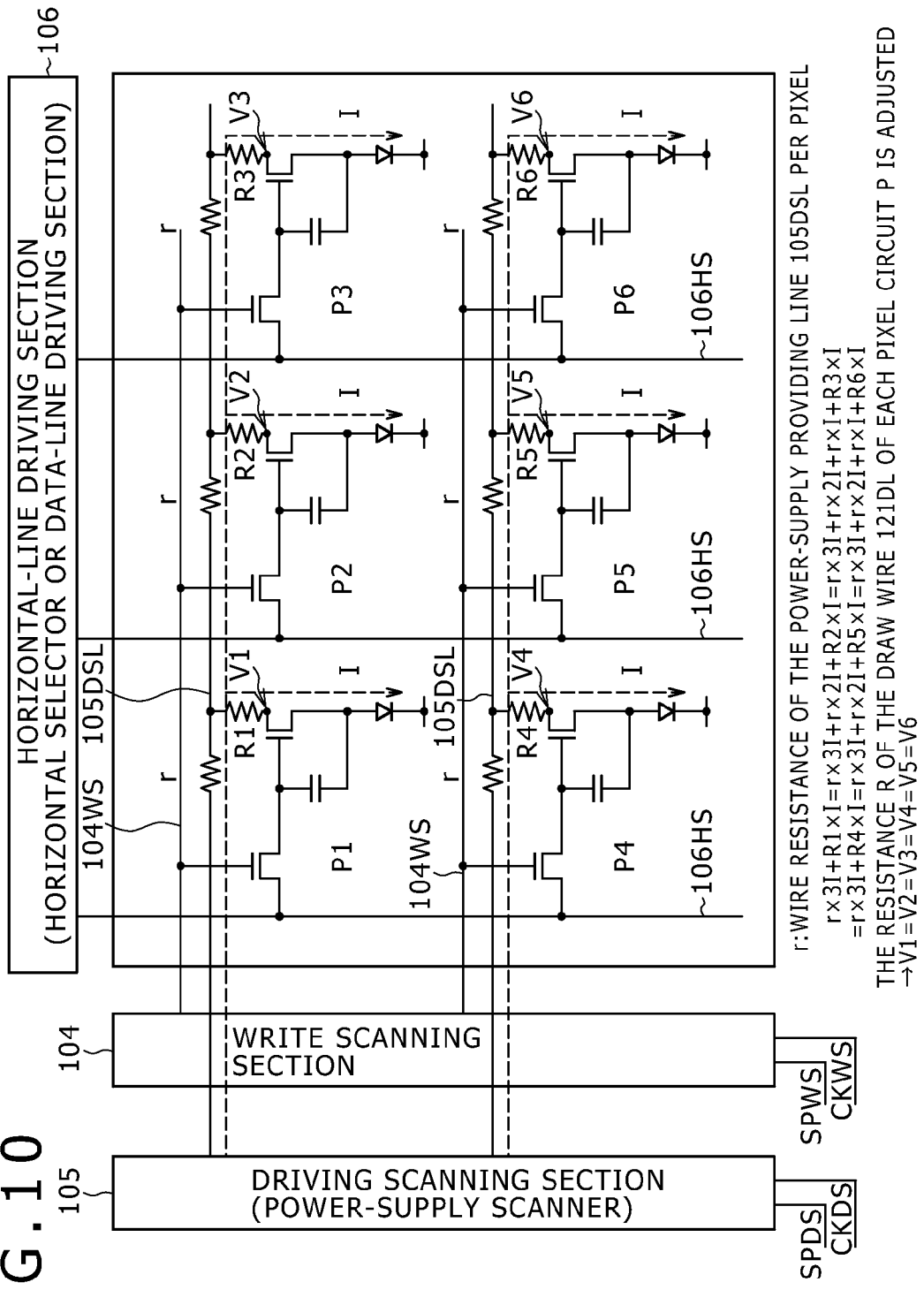

- FIRST WIRING LAYER L1 (MOLYBDENUM OR THE LIKE)
- SECOND WIRING LAYER L2 (ALUMINUM, TUNGSTEN OR THE LIKE)
- THIRD WIRING LAYER L3 (POLY-SILICON OR THE LIKE)
- CONTACT BETWEEN THE FIRST WIRING LAYER L1 AND THE SECOND WIRING LAYER L2
- CONTACT BETWEEN THE SECOND WIRING LAYER L2 AND THE THIRD WIRING LAYER L3

TO THE ORGANIC EL DEVICE 127

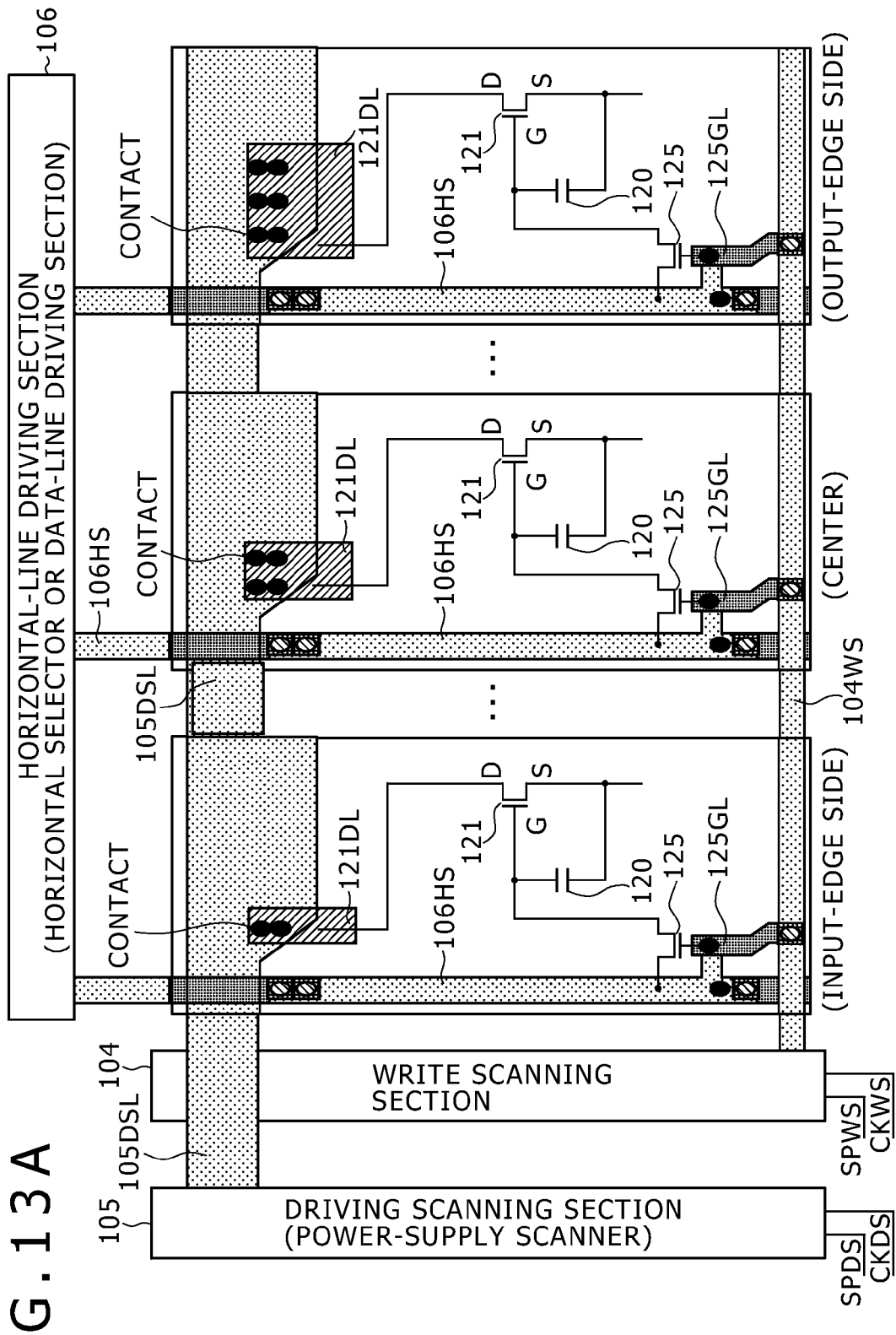

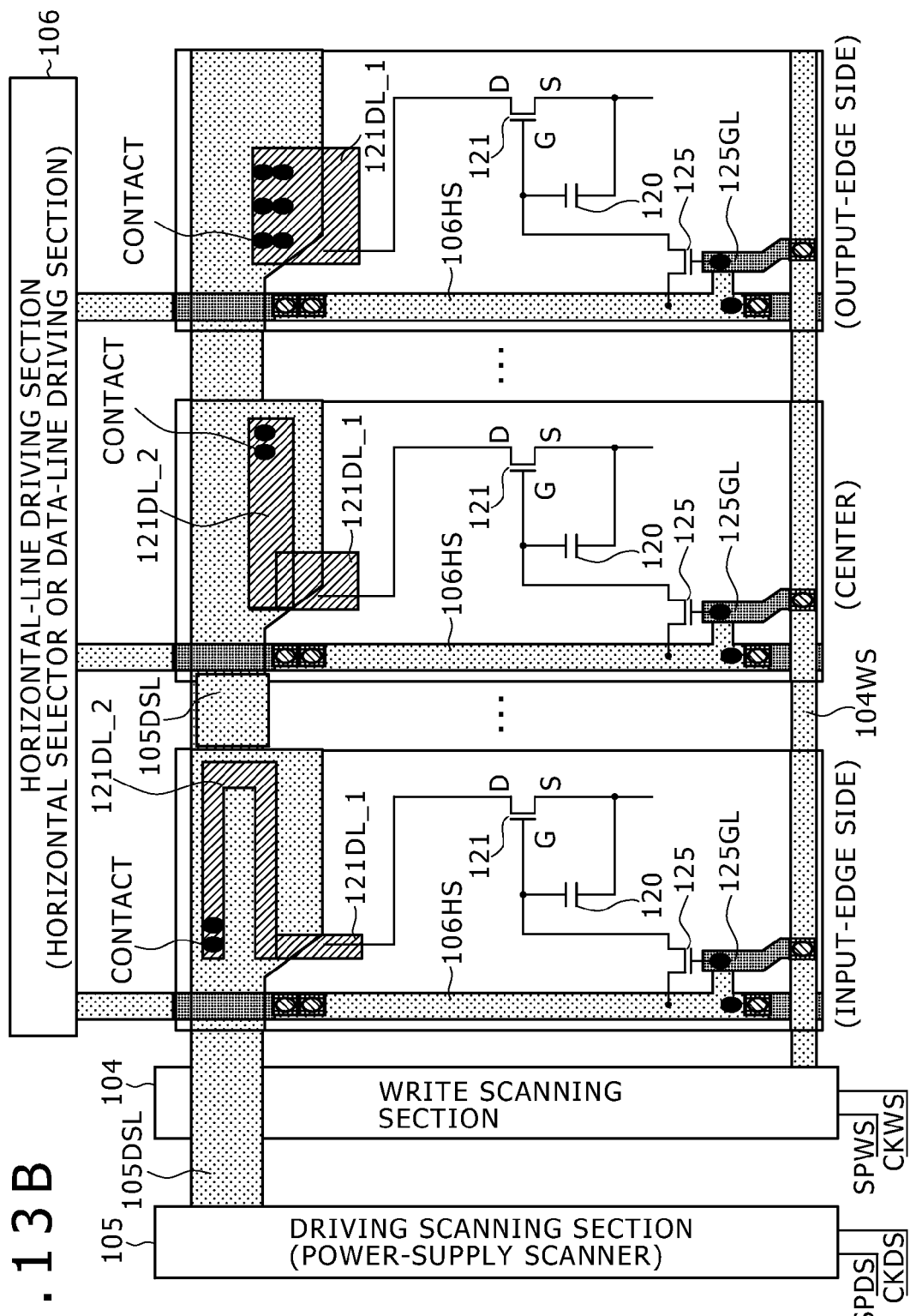

DISPLAY APPARATUS

CROSS REFERENCES TO RELATED APPLICATIONS

This is a Continuation application of U.S. patent application Ser. No. 12/385,189, filed Apr. 1, 2009, which claims priority from Japanese Patent Application JP 2008-106456 filed with the Japanese Patent Office on Apr. 16, 2008 the entire contents of which being incorporated herein by reference.

BACKGROUND OF THE INVENTION

1. Field of the Invention

The present invention relates to a display apparatus employing pixel circuits each having an electro-optical device. The pixel circuit is also referred to merely as a pixel whereas the electro-optical device is also referred to as a display device or a light emitting device. To put it in more detail, the present invention relates to a display apparatus in which each of the pixel circuits employs an electro-optical device to serve as an electrically driven display device emitting light with a luminance varying in accordance with the magnitude of a driving signal driving the device and employs an active element for controlling the driving signal so that the display apparatus can be driven to display an image in pixel units.

2. Description of the Related Art

There is a display apparatus employing pixel circuits each having an electro-optical device serving as a display device which emits light with a luminance varying in accordance with the magnitude of a driving signal which is a voltage applied to the device or a current flowing through the device. For example, a liquid crystal display device is a typical electro-optical device which emits light with a luminance varying in accordance with the magnitude of a voltage applied to the device. On the other hand, an organic EL (Electro Luminescence) device and an OLED (Organic Light Emitting Diode) are each a typical electro-optical device which emits light with a luminance varying in accordance with the magnitude of a current flowing through the device. A display apparatus employing pixel circuits each including an organic EL device is referred to as an organic EL display apparatus which is a display apparatus of the so-called light-self-emission type. A display apparatus of the light-self-emission type is a display apparatus employing pixel circuits each including an electro-optical device of the light-self-emission type.

The organic EL device has an organic thin film which is also referred to as an organic layer sandwiched by a lower electrode and an upper electrode. The organic layer is a laminated layer composed of an organic hole transport layer and an organic light emitting layer. The organic EL device is an electro-optical device utilizing a phenomenon in which light is emitted when an electric field is applied to the organic thin film. Thus, by controlling a current flowing through the organic EL device, it is possible to obtain gradations of emitted colors.

Since the organic EL device can be driven by a relatively low voltage such as a voltage not exceeding 10 V, the organic EL device has a low power consumption. In addition, since the organic EL device is a light self-emitting device which emits light by itself, the organic EL display apparatus employing pixel circuits each having an organic EL device does not require an auxiliary illumination member such as a backlight which is needed in a liquid-crystal display apparatus. It is thus easy to reduce the weight and thickness of the organic EL display apparatus employing pixel circuits which each have an organic EL device. On top of that, since the response speed of the organic EL device is extremely high, a residual image of a moving-image display is not generated. A typical response time of the organic EL device has a value of the order of several microseconds. Due to the merits offered by the organic EL device as described above, a planar light-self-emission display apparatus, which employs pixel circuits each having an organic EL device to serve as an electro-optical device, is developed intensively and extensively in recent years.

By the way, a display apparatus employing pixel circuits each having an electro-optical device can adopt a simple (passive) matrix method or an active matrix method as a driving method. Representative examples of the display apparatus employing pixel circuits each having an electro-optical device are a liquid-crystal display apparatus employing pixel circuits each having a liquid-crystal display device and an organic EL display apparatus employing pixel circuits each having an organic EL device. However, even though a display apparatus adopting the simple matrix method has a simple structure, such a display apparatus raises a problem that it is difficult to design the display apparatus into a display apparatus having a large size or a high-definition display apparatus.

In order to solve the problem described above, the active matrix method is developed intensively and extensively in recent years. In accordance with the active matrix method, a pixel signal supplied to a light emitting device employed in a pixel circuit is controlled by making use of an active device, which is employed in the same pixel circuit as the light emitting device, as a switching device. A typical example of the active device is an insulated-gate FET (Field Effect Transistor) which is generally a TFT (Thin Film Transistor).

In order to drive an electro-optical device of such a pixel circuit to emit light, an input image signal is supplied to a signal holding capacitor employed in the pixel circuit to serve as a capacitor for holding the input image signal. The input image signal is supplied to the signal holding capacitor employed in the pixel circuit through a video-signal line. In the pixel circuit, the input image signal is supplied from the video-signal line to the gate electrode of a driving transistor for driving the electro-optical device as well as a signal holding capacitor connected to the gate electrode. The input image signal is supplied from the video-signal line to the gate electrode of the driving transistor as well as the signal holding capacitor by way of a switching transistor which is also referred to as a sampling transistor. In this way, a driving signal according to the voltage of the input image signal held in the signal holding capacitor is then supplied to the electro-optical device. It is to be noted that, in the following description, the gate electrode of the driving transistor is also referred to as a control input terminal of the driving transistor whereas the signal holding capacitor is also referred to as a pixel capacitor.

In a liquid-crystal display apparatus employing pixel circuits each having a liquid-crystal display device to serve as an electro-optical device, the liquid-crystal display device is a device of a voltage-driven-emission type. Thus, the liquid-crystal display device is driven by a voltage signal according to the input image signal held in the signal holding capacitor. In an organic EL display apparatus employing pixel circuits each having a current-driven-emission device such as an organic EL device to serve as an electro-optical device, on the other hand, the voltage signal according to the input image signal held in the signal holding capacitor is converted by the driving transistor into a current signal and the organic EL device is driven by the current signal.

Represented by an organic EL device, the electro-optical device of the current-driven-emission type is a device emitting light with a luminance which varies as the current driving the device varies. In order to drive the electro-optical device to emit light with a stable luminance, it is important to supply a stable driving current to the electro-optical device. Methods for supplying a driving current to an organic EL device are classified typically into two large categories, i.e., a constant-current driving method and a constant-voltage driving method. Since each of the constant-current driving method and the constant-voltage driving method is a method based on a known technology, however, the references made available to the public as references disclosing these methods are not given in this patent specification.

Since the voltage-current characteristic of the organic EL device has a large gradient, execution of the constant-voltage driving method gives rise to large current variations due to even small variations in voltage and/or small variations in device characteristic. The large variations in current in turn bring about large variations in luminance. For this reason, it is generally necessary to adopt the constant-current driving method which makes use of the driving transistor in a saturated region. Of course, even in the case of the constant-current driving method, if variations in current exist, such variations will result in variations in luminance. If the variations in current are small, however, the variations in luminance are also small as well.

Conversely, even if the constant-current driving method is adopted, in order to make the luminance of light emitted by the electro-optical device stable, it is important to sustain the driving signal, which is being held in the signal holding capacitor as a signal according to the input image signal, at a fixed magnitude. For example, in order to make the luminance of light emitted by the organic EL device stable, it is important to sustain the driving current, which is flowing through the driving transistor as a current according to the input image signal, at a fixed magnitude.

By the way, variations in manufacturing process inevitably give rise to threshold-voltage and mobility variations of an active device for driving the electro-optical device. In addition, the characteristic of the electro-optical device such as the organic EL device also changes with the lapse of time. These threshold-voltage and mobility variations of the active device for driving the electro-optical device and these changes of the characteristic of the electro-optical device undesirably have an effect on the luminance of light emitted by the electro-optical device.

For the reasons described above, in order to control the luminance of light emitted by the electro-optical device to a value uniform throughout the entire display screen of the display apparatus, there has been studied a variety of mechanisms for compensating each pixel circuit for the threshold-voltage and mobility variations of the active device employed in the pixel circuit to serve as a device for driving the electro-optical device and for the changes of the characteristic of the electro-optical device of the pixel circuit.

For example, a mechanism described in Japanese Patent Laid-Open No. 2007-310311 (hereinafter referred to as Patent Document 1) has three proposed functions, i.e., a threshold-voltage compensation function, a mobility compensation function and a bootstrap function, for a pixel circuit employing an organic EL device. The threshold-voltage compensation function is a function for sustaining the driving current generated by the driving transistor at a constant magnitude, given a constant input image signal, even if the threshold voltage of the driving transistor varies from transistor to transistor and changes with the lapse of time. The mobility compensation function is a function for sustaining the driving current generated by the driving transistor at a constant magnitude, given a constant input image signal, even if the mobility of the driving transistor varies from transistor to transistor and changes with the lapse of time. The bootstrap function is a function for sustaining the driving current generated by the driving transistor at a constant magnitude, given a constant input image signal, even if the current-voltage characteristic of the organic EL device changes with the lapse of time.

SUMMARY OF THE INVENTION

In the mechanism described in Patent Document 1, however, the drain electrode of the driving transistor is connected to a power-supply providing line to which a pulse power-supply voltage is applied in a vertical scanning operation. The drain electrode of the driving transistor is also referred to as a power-supply providing terminal of the driving transistor or a power-supply providing terminal of the pixel circuit whereas the power-supply providing line is a typical vertical scanning line. Since it is necessary to provide the current-driven-emission light emitting device such as the organic EL device with a current, which is sufficiently large for driving the light emitting device to emit light, a relatively large current flows from a power-supply generation source through the power-supply providing line to the light emitting device by way of the driving transistor. Thus, a power-supply voltage generated by a power-supply generation source such as a driving scanning section and applied to the power-supply providing line decreases by a drop which is gradually increasing with the distance between a location (at which the power-supply voltage is observed) on the power-supply providing line and the power-supply generation source. As a result, an electric potential appearing on the power-supply providing terminal of the driving transistor is lower than the power-supply voltage appearing on the power-supply generation source by a difference, and the longer the distance from the power-supply generation source to the driving transistor, the larger the difference.

In such a case, the longer the distance from the power-supply generation source to a driving transistor, the smaller the voltage appearing between the drain and source electrodes of the driving transistor. That is to say, the voltage appearing between the drain and source electrodes of a driving transistor decreases gradually from pixel to pixel as the distance between the pixel circuit and the power-supply generation source increases. Thus, the pixel circuit including the transistor is affected by the so-called early effect. For this reason, even if the method described in Patent Document 1 as a method for eliminating variations in characteristics is adopted, the driving current generated by a driving transistor gradually decreases as the distance between the driving transistor and the power-supply generation source increases. Thus, the luminance of light emitted by the light emitting device also undesirably decreases gradually as well. If the luminance of light emitted by the light emitting device decreases gradually, luminance irregularities such as shadings and crosstalk are generated unavoidably. In the case of a color display apparatus, the luminance irregularities appear on the screen as color irregularities.

Addressing the problem described above, inventors of the present invention have innovated a mechanism capable of preventing display irregularities such as luminance and color irregularities from being generated due to drops of voltages appearing on power-supply providing terminals of driving transistors.

An embodiment implementing a display apparatus provided by the present invention has a pixel array section including: pixel circuits which are each provided with a driving transistor and an electro-optical device and are laid out to form a matrix; and a draw wire provided in each of the pixel circuits to serve as a wire connecting the driving transistor to a power-supply providing line, wherein the resistance of the draw wire is relatively large in the pixel circuit close to a source applying a power-supply voltage to the power-supply providing line.

For example, under a condition to drive the electro-optical devices employed in the pixel circuits to emit light with a uniform luminance, at least one of the length and width of any one of the draw wires are set so that the electric potentials appearing on the power-supply providing terminals of the driving transistors become uniform for all the driving circuits.

In a display apparatus having a pixel array section including pixel circuits each employing a current-driven-emission electro-optical device, the length and width of any one of the draw wires each provided in one of the pixel circuits arranged in the longitudinal direction of the power-supply providing line are adjusted in such a way that, under a condition to drive the light emitting devices employed in the pixel circuits to emit light with a uniform luminance, at least one of the length and width of any one of the draw wires are set so that the electric potentials appearing on the power-supply providing terminals of the driving transistors become uniform for all the driving circuits.

In accordance with the embodiment of the present invention, the draw wires are created to form a layout in the pixel circuits by adjusting at least one of the resistance of any one of the draw wires at such varying values that, under a condition to drive the light emitting devices employed in the pixel circuits to emit light with a uniform luminance, at least one of the length and width of any one of the draw wires are set so that the electric potentials appearing on the power-supply providing terminals of the driving transistors become uniform for all the driving circuits. Thus, it is possible to prevent luminance irregularities such as shadings and crosstalk from being generated due to voltage drops along power-supply providing lines. As a result, a display apparatus having a high image quality can be obtained.

BRIEF DESCRIPTION OF THE DRAWINGS

These and other features of the embodiments of the present invention will become clear from the following description of the preferred embodiments given with reference to the accompanying diagrams, in which:

FIG. 4 is a diagram showing a second typical comparison configuration for the pixel circuit according to this embodiment;

FIG. 6 is a timing diagram showing a plurality of explanatory timing charts to be referred to in description of basic driving timings of the embodiment shown in the diagram of FIG. 5 as an embodiment implementing the pixel circuit;

FIG. 9A is an explanatory circuit diagram to be referred to in description of effects of the wire resistance of the power-supply providing line;

FIG. 9B is an explanatory diagram showing the Vds-Ids characteristic of a driving transistor;

FIG. 9C is an explanatory diagram showing a phenomenon which is observed when a window pattern is displayed;

FIG. 10 is an explanatory conceptual diagram to be referred to in description of a mechanism provided in accordance with a variety of embodiments to serve as a mechanism for repressing display irregularities caused by voltage drops at a plurality of points along the power-supply providing line;

FIG. 13A is an explanatory diagram serving as a model diagram to be referred to in description of a typical layout according to the second embodiment implementing the basic principle explained earlier by referring to the diagram of FIG. 10 by changing the width of a draw wire in each pixel circuit; and FIG. 13B is an explanatory diagram serving as a model diagram to be referred to in description of a typical layout according to the third embodiment implementing the basic principle explained earlier by referring to the diagram of FIG. 10 by changing the length and width of a second draw wire in each pixel circuit.

DETAILED DESCRIPTION OF THE PREFERRED EMBODIMENTS

Preferred embodiments of the invention are described in detail by referring to diagrams as follows.

<Outline of the Entire Display Apparatus>

Figure 1:
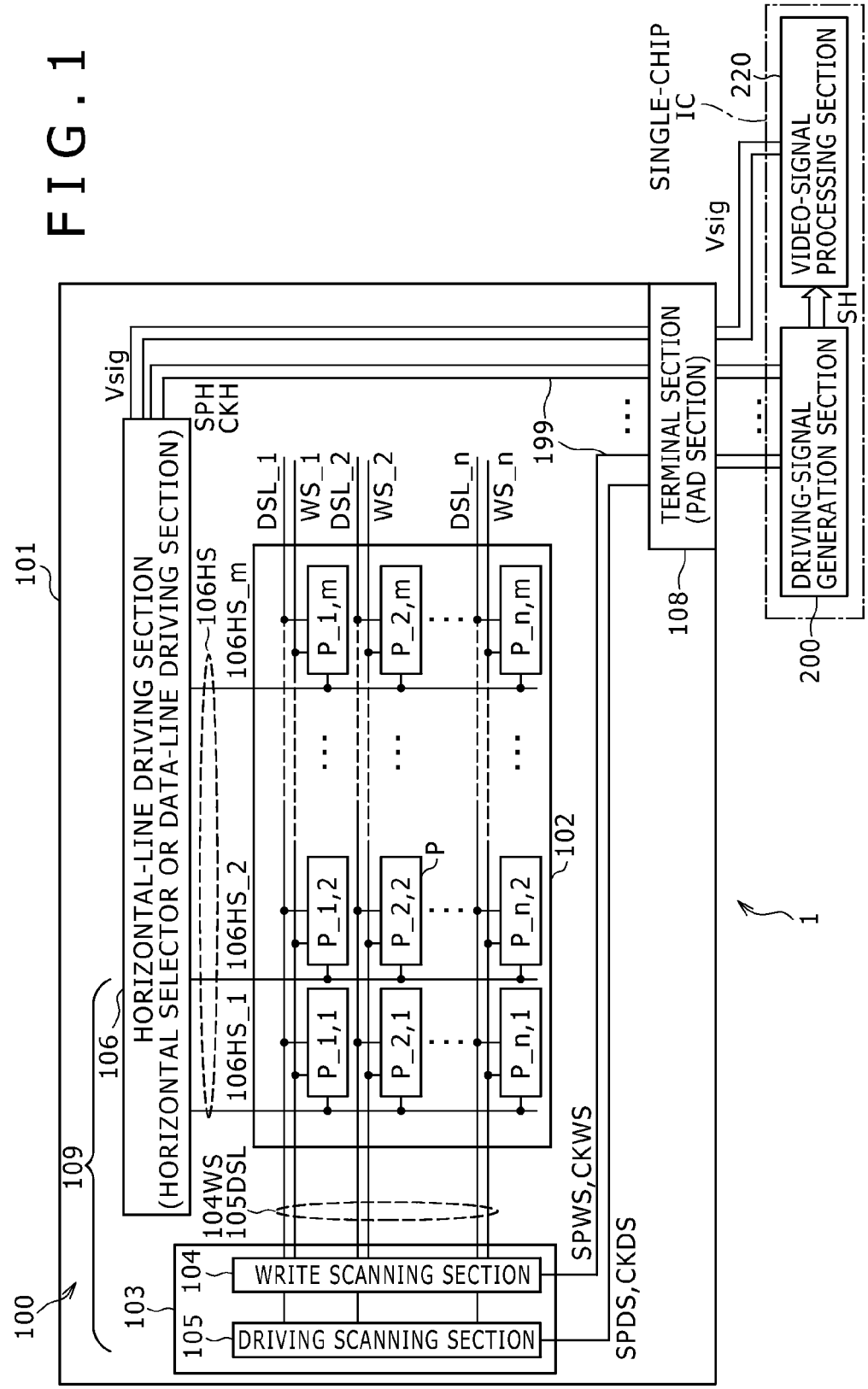
FIG. 1 is a block diagram roughly showing a typical configuration of an active-matrix organic EL display apparatus according to an embodiment of the present invention.

FIG. 1 is a block diagram roughly showing a typical configuration of an active-matrix organic EL display apparatus 1 according to an embodiment of the present invention. The embodiment to be explained below is a present-invention implementation in which, in each pixel circuit included in the typical configuration shown in the block diagram of the figure, as an example, an organic EL device of the current-driven-emission type is used as a display device whereas a poly-silicon TFT (Thin Film Transistor) is used as the active device for driving the organic EL device. The embodiment implements an active-matrix organic EL display apparatus built up by creating organic EL devices on a semiconductor substrate on which the poly-silicon TFTs have been formed. As described earlier, in the following description, the display device is also referred to as an electro-optical device or a light emitting device whereas the active-matrix organic EL display apparatus is also referred to as an organic EL display apparatus or just a display apparatus. Typically, the TFT is an FET (Field Effect Transistor).

The display apparatus 1 is used as a display section in various kinds of electronic equipment, which employs a recording medium such as a semiconductor memory, an MD (MiniDisc, Registered Trademark of Sony Corporation) or a cassette tape, in all fields. Examples of such electronic equipment are a portable music player, a digital camera, a notebook personal computer, a portable terminal such as a cellular phone and a video camera. The display section is a section for displaying a video signal supplied to the electronic apparatus or a video signal generated in the electronic apparatus as a standstill or moving picture (image).

It is to be noted that, in the following description explaining the whole configuration of the display apparatus 1, an organic EL device of a pixel circuit is used as a display device of the pixel circuit. However, the organic EL device is no more than a typical display device. That is to say, the display device is by no means limited to the organic EL device. For example, any electro-optical device can generally be used as the display device as far as the electro-optical device is a current-driven-emission electro-optical device. In addition, the display device used in this embodiment can also be used in all other embodiments described later or, in particular, in embodiments each implementing a countermeasure against a drop of from a voltage generated by the power-supply generation source to the voltage appearing on the power-supply providing terminal of the driving transistor.

As shown in the block diagram of FIG. 1, the display apparatus 1 employs a display panel section 100, a driving-signal generation section 200 and a video-signal processing section 220. The display panel section 100 has a pixel array section 102 which serves as a main component. The pixel array section 102 includes a plurality of pixel circuits P laid out to form a pixel matrix in an effective video area having a display aspect ratio of X:Y. Also referred to as a pixel P, each of the pixel circuits P has an organic EL device serving as a display device which is not shown in the block diagram of FIG. 1. The display aspect ratio of the effective video area is defined as the ratio of the height X of the area to the width Y of the area. A typical value of the display aspect ratio is 9:16. Referred to as the so-called timing generator, the driving-signal generation section 200 is a typical example of a panel control section for generating a variety of panel signals for controlling and driving the display panel section 100. The driving-signal generation section 200 and the video-signal processing section 220 are embedded in a single-chip IC (Integrated Circuit). In the case of this embodiment, the single-chip IC including the driving-signal generation section 200 and the video-signal processing section 220 is installed externally to the display panel section 100.

In the case of the configuration shown in the block diagram of FIG. 1, in the display panel section 100, the pixel array section 102 described above is put on a substrate 101. A vertical-direction driving section 103 and a horizontal-direction driving section 106 are mounted on the substrate 101. The vertical-direction driving section 103 is a section for scanning the pixel circuits P in the vertical direction whereas the horizontal-direction driving section 106 is a section for scanning the pixel circuits P in the horizontal direction. The horizontal-direction driving section 106 is also referred to as a horizontal selector or a data-line driving section. On top of that, a terminal section 108 used for connecting the display panel section 100 to the external components such as the driving-signal generation section 200 and the video-signal processing section 220 is placed on an edge of a side of the display panel section 100. The terminal section 108 also referred to as a pad section. It is to be noted that, if required, an interface (IF) section serving as an interface between external circuits and the vertical-direction driving section 103 as well as between external circuits and the horizontal-direction driving section 106 may be mounted in some cases.

Typically, the vertical-direction driving section 103 employs a write scanning section 104 and a driving scanning section 105. The write scanning section 104 is also referred to as a write scanner WS. Also referred to as a drive scanner DS, the driving scanning section 105 functions as a power-supply scanner which has a power-supply providing power. As an example, the pixel array section 102 is driven by the vertical-direction driving section 103 including the write scanning section 104 and the driving scanning section 105 from one side of the pixel array section 102 or two sides separated away from each other in the left-to-right direction of the block diagram of FIG. 1 as the two sides of the pixel array section 102. By the same token, the pixel array section 102 is driven by the horizontal-direction driving section 106 from one side of the pixel array section 102 or two sides separated away from each other in the top-down or bottom-up direction of the bock diagram of FIG. 1 as the two sides of the pixel array section 102.

The vertical-direction driving section 103, which employs the write scanning section 104 and the driving scanning section 105, and the horizontal-direction driving section 106 form a control section 109 for controlling a write operation to store the electric potential of a signal into the signal holding capacitor. The control section 109 also controls a threshold-voltage compensation operation, a mobility compensation operation and a bootstrap operation which will be described later in detail. The control section 109 is thus a circuit for driving the pixel circuits P of the pixel array section 102.

As described above, in the configuration of this implementation, the peripheral driving circuits such as the vertical-direction driving section 103 and the horizontal-direction driving section 106 are mounted on the substrate 101 which is the same substrate as the pixel array section 102.

In the typical configuration shown in the block diagram of FIG. 1, the driving-signal generation section 200 serving as a signal source external to the display apparatus 1 supplies a variety of pulse timing signals to the display panel section 100 by way of the terminal section 108. However, the driving-signal generation section 200 can also be created as a semiconductor chip mounted on the display panel section 100.

As described above, the driving-signal generation section 200 serving as a signal source external to the display apparatus 1 supplies a variety of pulse timing signals to the display panel section 100 by way of the terminal section 108. In the same way, the video-signal processing section 220 serving as a signal source external to the display apparatus 1 supplies a video signal Vsig to the display panel section 100 by way of the terminal section 108. In the case of a color display apparatus 1, the video signal Vsig includes video signals of three colors, i.e., a red video signal Vsig_R, a green video signal Vsig_G and a blue video signal Vsig_B.

As an example, vertical write/drive pulse signals output from the terminal section 108 include necessary pulse signals such as vertical-direction shift start pulses SPDS and SPWS as well as vertical-direction scanning clock signals CKDS and CKWS. If required, the vertical write/drive pulse signals may include also vertical scanning clock signals xCKDS and xCKWS which have phases opposite to the phases of the vertical scanning clock signals CKDS and CKWS respectively.

By the same token, horizontal-direction driving pulse signals output from the terminal section 108 include necessary pulse signals such as a horizontal-direction start pulse SPH and a horizontal-direction clock signal CKH. If required, the horizontal-direction driving pulse signals may include also a horizontal-direction clock signal xCKH which has a phase opposite to the phase of the horizontal-direction clock signal CKH.

Terminals of the terminal section 108 are connected to the vertical-direction driving section 103 and the horizontal-direction driving section 106 by signal lines 199. If necessary, the voltage level of each pulse supplied to the terminal section 108 from the driving-signal generation section 200 and the video-signal processing section 220 is typically adjusted by a level shifting section embedded in the terminal section 108 before being supplied to the vertical-direction driving section 103 and the horizontal-direction driving section 106 by way of a buffer also embedded in the terminal section 108. It is to be noted that the level shifting section and the buffer themselves are not shown in the block diagram of FIG. 1.

The pixel array section 102 employs pixel circuits P arranged two-dimensionally to form a pixel matrix. Each of the pixel circuits P includes an organic EL device serving as a display device and a pixel transistor serving as a driving transistor for driving the organic EL device as will be described later in detail. The organic EL device and the driving transistor themselves are not shown in the block diagram of FIG. 1. For each pixel row of the pixel matrix, a pair of scanning lines 104WS and 105DSL are provided. By the same token, for each pixel column of the pixel matrix, a signal line 106HS is provided.

In the typical configuration of the pixel array section 102, the scanning lines 104WS and 105DSL are created as scanning lines used in the vertical-direction scanning operation whereas the signal line 106HS is created as a video-signal line (or a data line) used in the horizontal-direction scanning operation. At each intersection of a vertical-direction scanning line pair, which includes the vertical-direction scanning lines 104WS and 105DSL, and the video-signal line 106HS used in the horizontal-direction scanning operation, an organic EL device and a TFT serving as the driving transistor for driving the organic EL device are created. The organic EL device and the driving transistor are combined to form a pixel circuit P. As described above, the organic EL device and the driving transistor themselves are not shown in the block diagram of FIG. 1.

To put concretely, for the pixel circuits P laid out to form the pixel matrix, write scanning lines 104WS_1 to 104WS_n are provided. To put it in detail, the write scanning lines 104WS_1 to 104WS_n are provided respectively for the n pixel rows of the pixel matrix. Each of the write scanning lines 104WS_1 to 104WS_n is a line for propagating a write driving pulse WS generated by the write scanning section 104.

By the same token, for the pixel circuits P laid out to form the pixel matrix, power-supply providing lines 105DSL_1 to 105DSL_n are provided. To put it in detail, the power-supply providing lines 105DSL_1 to 105DSL_n are provided respectively for the n pixel rows of the pixel matrix. Each of the power-supply providing lines 105DSL_1 to 105DSL_n is a line for propagating a power-supply driving pulse DSL generated by the driving scanning section 105.

On the other hand, for the pixel circuits P laid out to form the pixel matrix, video-signal lines 106HS_1 to 106HS_m are provided. To put it in detail, the video signal lines 106HS_1 to 106HS_m are provided respectively for the m pixel columns of the pixel matrix. Each of the video signal lines 106HS_1 to 106HS_m is a line for propagating a video signal Vsig generated by the horizontal-direction driving section 106.

Each of the write scanning section 104 and the driving scanning section 105 is designed as a combination of logic gates forming latches and registers. Each of the write scanning section 104 and the driving scanning section 105 selects a matrix row of pixel circuits P employed in the pixel array section 102. That is to say, the write scanning section 104 selects one of the write scanning lines 104WS_1 to 104WS_n sequentially on a line-after-line basis in accordance with a pulse signal received from the driving-signal generation section 200 as a pulse signal generated for a vertical-direction driving system.

By the same token, the driving scanning section 105 selects one of the power-supply providing lines 105DSL_1 to 105DSL_n sequentially on a line-after-line basis in accordance with a pulse signal received from the driving-signal generation section 200 as a pulse signal generated for a vertical-direction driving system.

In the same way as the write scanning section 104 and the driving scanning section 105, the horizontal-direction driving section 106 is designed as a combination of logic gates forming latches and registers. However, the horizontal-direction driving section 106 selects a matrix column of pixel circuits P employed in the pixel array section 102. That is to say, the horizontal-direction driving section 106 selects one of the video signal lines 106HS_1 to 106HS_m sequentially on a line-after-line basis in accordance with a pulse signal received from the driving-signal generation section 200 as a pulse signal generated for a horizontal-direction driving system. The horizontal-direction driving section 106 samples a predetermined electric potential of the video signal Vsig and stores the sampled electric potential into the signal holding capacitor, which is employed in each of the pixel circuits P provided on the selected matrix column associated with the selected video signal line 106HS, through the selected video signal line 106HS.

The display apparatus 1 according to this embodiment can be driven sequentially on a line-after-line basis or a point-after-point basis. To put it in detail, each of the write scanning section 104 and the driving scanning section 105, which are employed in the vertical-direction driving section 103, scans the pixel array section 102 sequentially on a line-after-line basis, that is, on a row-after-row basis. In synchronization with the scanning operations carried out by the write scanning section 104 and the driving scanning section 105, the horizontal-direction driving section 106 supplies image signals of one pixel row to the pixel array section 102 at the same time (in the case of a line-after-line driving operation) or supplies an image signal for each pixel circuit P to the pixel array section 102 (in the case of a point-after-point driving operation).

It is to be noted that a display-apparatus product is by no means limited to the display apparatus 1 built up as a module of compound components including the display panel section 100, the driving-signal generation section 200 and the video-signal processing section 220 as shown in the block diagram of FIG. 1. For example, it is possible to present a display apparatus including only the display panel section 100 or only the pixel array section 102.

As a typical example, the display apparatus 1 includes a module of a sealed configuration. As another typical example, the display apparatus 1 is configured as a display module including only the display panel section 100 created by attaching a transparent facing glass plate on the pixel array section 102. On the transparent facing glass plate, a display layer, a color filter, a protection film, a light shielding film and other layers/films are created. In the case of this embodiment, the display layer is an organic layer and electrodes provided on both sides of the layer. In the case of the configuration of this display panel section 100, in addition to the pixel array section 102, electrical connection terminals are provided on an edge of the display panel section 100. The electrical connection terminals are external connection terminals for electrically connecting the pixel array section 102 to an external component such as an FPC (Flexible Print Circuit) having a mounted circuit. The circuit mounted on the FPC has the same functions as the vertical-direction driving section 103 and the horizontal-direction driving section 106. As described earlier, the vertical-direction driving section 103 and the horizontal-direction driving section 106 receive a variety of driving pulses and a video signal Vsig from external sources and supply the driving pulses and the video signal Vsig to the pixel array section 102. With regard to the other components, the configuration of this display panel section 100 is basically identical with the configuration shown in the block diagram of FIG. 1.

As described earlier, in the configuration shown in the block diagram of FIG. 1, the pixel array section 102 is driven by the vertical-direction driving section 103 including the write scanning section 104 and the driving scanning section 105 from only one side of the pixel array section 102. As an alternative, the pixel array section 102 can also be driven by the vertical-direction driving section 103 from two sides separated away from each other in the left-to-right direction of the bock diagram of FIG. 1 as the two sides of the pixel array section 102. In this case, two vertical-direction driving sections 103 sandwich the pixel array section 102.

By the same token, in the configuration shown in the block diagram of FIG. 1, the pixel array section 102 is driven by the horizontal-direction driving section 106 from only one side of the pixel array section 102. As an alternative, the pixel array section 102 can also be driven by the horizontal-direction driving section 106 from two sides separated away from each other in the top-down or bottom-up direction of the bock diagram of FIG. 1 as the two sides of the pixel array section 102. In this case, two horizontal-direction driving sections 106 sandwich the pixel array section 102.

<First Typical Comparison Configuration of the Pixel Circuit>

Figure 2:
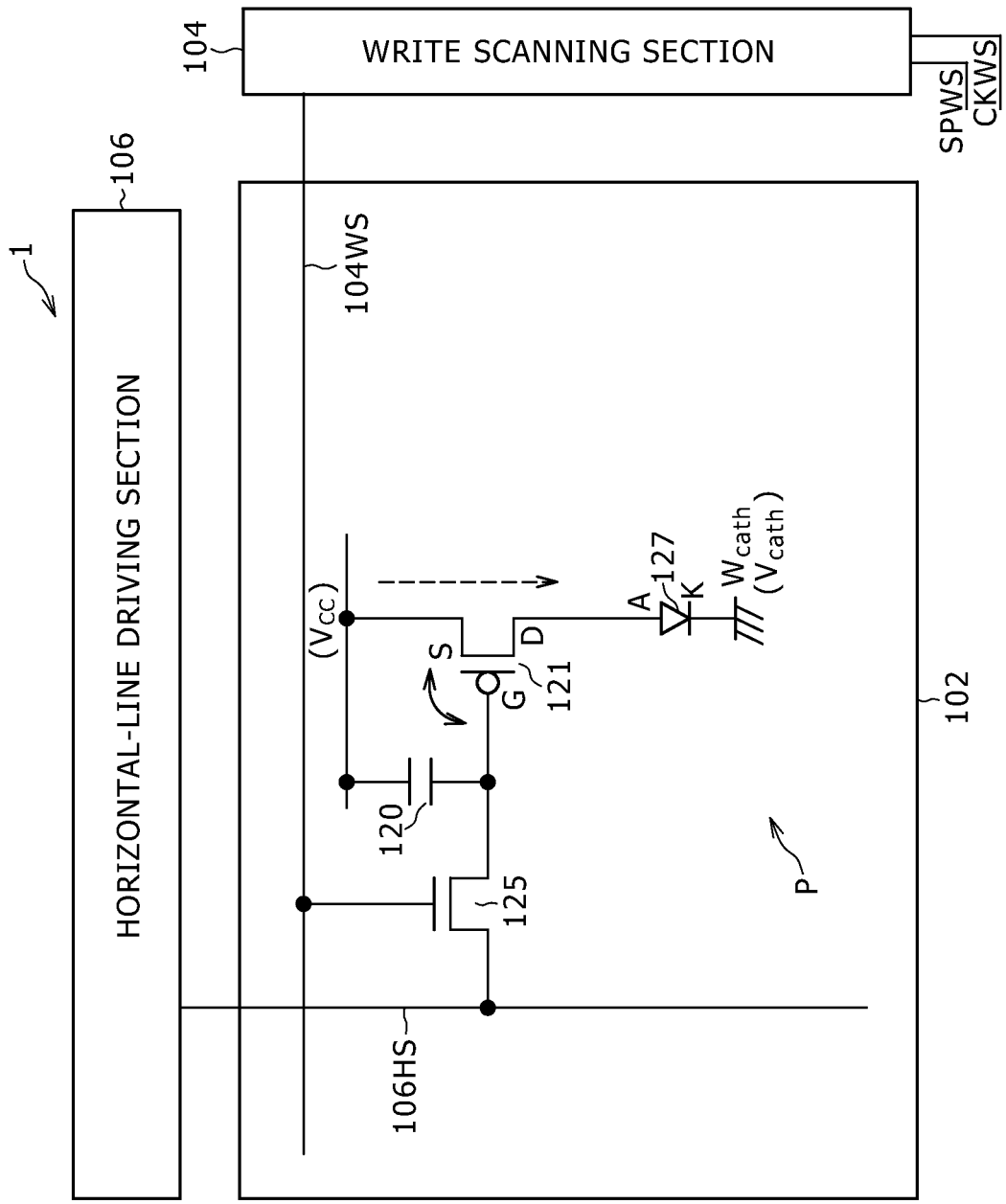
FIG. 2 is a diagram showing a first typical comparison configuration for a pixel circuit according to this embodiment.

FIG. 2 is a diagram showing a first typical comparison configuration for the pixel circuit P according to this embodiment. It is to be noted that the diagram of FIG. 2 also shows the write scanning section 104, the vertical-direction driving section 103 and the horizontal-direction driving section 106, which are located on peripheries of the pixel array section 102 placed on the substrate 101 of the display panel section 100.

Each of transistors employed in the first typical comparison configuration of the pixel circuit P is a MOS (Metal Oxide Semiconductor) FET (Field Effect Transistor). One of the transistors employed in the first typical comparison configuration is a driving transistor 121. The gate electrode G of the driving transistor 121 functions as a control input terminal. A specific one of the source electrode S and drain electrode D of the driving transistor 121 serves as an input terminal whereas the other one of the source electrode S and the drain electrode D is used as an output terminal. In particular, used as a source for supplying a driving current Ids to an organic EL device 127, the source electrode S of the driving transistor 121 functions as the output terminal whereas the drain electrode D of the driving transistor 121 serves as the input terminal which is a power-supply providing terminal. The following description explains a typical pixel circuit P having a configuration including two transistors. The configuration including two transistors is also referred to as a 2TR-driven configuration.

Since the organic EL device 127 is a current-driven-emission light emitting device, the gradation of a generated color is obtained by controlling the magnitude of a driving current Ids flowing through the organic EL device 127. The first typical comparison configuration including two transistors as shown in the diagram of FIG. 2 as the configuration of the pixel circuit P is a conceivably simplest circuit. In the first typical comparison configuration, the driving transistor 121 is a p-channel FET whereas a sampling transistor 125 also referred to as a write transistor is an n-channel FET. In the following description, a p-channel FET is referred to as a Pch-type FET whereas an n-channel FET is referred to as an Nch-type FET.

The source electrode S of the Pch-type driving transistor 121 is connected to a power supply whereas the drain electrode D of the Pch-type driving transistor 121 is connected to the anode electrode of the organic EL device 127. The cathode electrode of the organic EL device 127 is connected to a cathode wire Wcath which is normally a ground wire GND. The gate electrode G of the driving transistor 121 is connected to the horizontal-direction driving section 106 through a video-signal line 106HS and the sampling transistor 125. A signal holding capacitor 120 is connected between the power supply and the gate electrode G of the driving transistor 121.

The horizontal-direction driving section 106 supplies a video signal Vsig to the gate electrode G of the driving transistor 121 through the video-signal line 106HS and the sampling transistor 125. By changing the voltage of the video signal Vsig supplied to the gate electrode G of the driving transistor 121, the magnitude of a driving current Ids flowing from the driving transistor 121 to the organic EL device 127 can be controlled. As described above, the source electrode S of the Pch-type driving transistor 121 is connected to the power supply. The driving transistor 121 is designed to operate in a saturated region in which the driving current Ids generated by the driving transistor 121 has a magnitude independent of a voltage appearing between the drain and source electrodes of the driving transistor 121.

Let reference notation Ids denote a current flowing between the drain and source electrodes of the driving transistor 121 operating in a saturated region, reference notation μ denote the mobility of the driving transistor 121, reference notation W denote the channel width (or the gate width) of the driving transistor 121, reference notation L denote the channel length (or the gate length) of the driving transistor 121, reference notation Cox denote the gate capacity (or the gate oxidation film capacity per unit area) of the driving transistor 121 and reference notation Vth denote the threshold voltage of the driving transistor 121. In this case, the driving current Ids generated by the driving transistor 121 functioning as a constant-current generator is expressed by Eq. (1) given below. It is to be noted that symbol "^" used in the equation denotes the exponentiation operator. As is obvious from Eq. (1), in the saturated region, the driving transistor 121 functions as a constant-current generator which generates a driving current Ids controlled by a gate-source voltage Vgs appearing between the gate and source electrodes of the driving transistor 121.

$$Ids = \frac{1}{2}\mu\frac{W}{L}Cox(V_{gs} - V_{th})^{\wedge}2 \quad (1)$$

<Change of Characteristic and the Effects of the Changes>

Figure 3A:
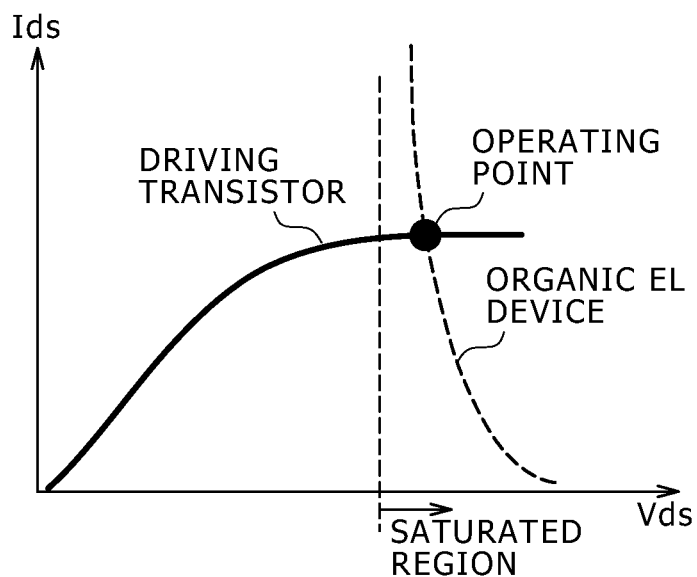
FIG. 3A is an explanatory diagram to be referred to in describing an operating point of the driving transistor and the organic EL device.
Figure 3B:
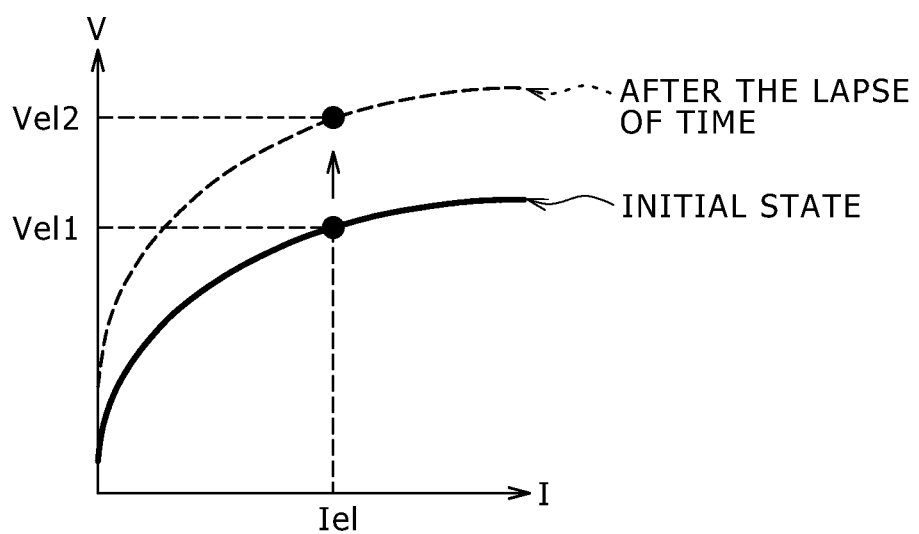
FIG. 3B is an explanatory diagram to be referred to in describing effects, which the changes of characteristics of the driving transistor and the organic EL device have on a driving current.

FIGS. 3A and 3B are explanatory diagrams referred to in describing changes of characteristics of pixel-configuration devices (that is, the driving transistor 121 and the organic EL device 127) and effects of the changes. To be more specific, FIG. 3A is an explanatory diagram referred to in describing an operating point of the driving transistor 121 and the organic EL device 127. On the other hand, FIG. 3B is an explanatory diagram referred to in describing effects, which the changes of characteristics of the driving transistor 121 and the organic EL device 127 have on the driving current Ids.

<I-V Characteristic of the Light Emitting Device>

In general, the I-V characteristic of a current-driven-emission light emitting device represented by an organic EL device deteriorates with the lapse of time as shown in the diagram of FIG. 3B. The I-V characteristic shown in the diagram of FIG. 3B is a relation between a current Iel flowing through the current-driven-emission light emitting device represented by an organic EL device and a voltage Vel applied to the device. A curve shown as a solid line represents the Iel–Vel characteristic exhibited by the organic EL device at an initial time. On the other hand, a curve shown as a dashed line represents the Iel–Vel characteristic exhibited by the organic EL device after the lapse of time.

For example, when a light-emission current Iel is flowing through the organic EL device 127 serving as a typical light emitting device, the anode-cathode voltage Vel appearing between the anode and cathode electrodes of the organic EL device 127 is determined uniquely. The driving current Ids is a current flowing between the drain and source electrodes of the driving transistor 121 in a light emission period. The driving current Ids flows to the anode electrode of the organic EL device 127 as the light-emission current Iel which determines the anode-cathode voltage Vel of the organic EL device 127 uniquely. With the lapse of time, however, the anode-cathode voltage Vel changes by a difference of (Vel2−Vel1) shown in the diagram of FIG. 3B even if the light-emission current Iel is sustained at a constant magnitude.

Since the I-V characteristic of the organic EL device 127 changes with the lapse of time as described above, the dashed-line curve shown in the diagram of FIG. 3A as the curve for the organic EL device 127 is shifted to the left, also shifting the position of an operating point shown in the diagram of FIG. 3A to the left and changing the voltage appearing on the drain electrode D of the driving transistor 121 employed in the same first typical comparison configuration of the pixel circuit P shown in the diagram of FIG. 2 as the organic EL device 127. Since the driving transistor 121 is operating in a saturated region, however, the driving current Ids generated by the driving transistor 121 has a magnitude independent of the voltage appearing on the drain electrode D of the driving transistor 121. That is to say, the driving current Ids generated by the driving transistor 121 has a magnitude dependent on the gate-source voltage Vgs of the driving transistor 121. Since the gate-source voltage Vgs of the driving transistor 121 does not change with the lapse of time, however, the driving current Ids having a magnitude, which does not change with the lapse of time, continues to flow to the organic EL device 127. Thus, the luminance of light emitted by the organic EL device 127 also does not change with the lapse of time.

<Second Typical Comparison Configuration of the Pixel Circuit>

FIG. 4 is a diagram showing a second typical comparison configuration for the pixel circuit P according to this embodiment. It is to be noted that the diagram of FIG. 4 also shows the write scanning section of the vertical-direction driving section 103 and the horizontal-direction driving section 106, which are located on peripheries of the pixel array section 102 placed on the substrate 101 of the display panel section 100.

In the second typical comparison configuration of the pixel circuit P, an Nch-type FET is employed as the driving transistor 121 to serve as a substitute for the Pch-type driving transistor 121 of the first typical comparison configuration of the pixel circuit P. Since the driving transistor 121 has the same type as the sampling transistor 125, the process of manufacturing the pixel circuit P becomes simpler. However, the second typical comparison configuration of the pixel circuit P raises a problem described as follows. In the case of the second typical comparison configuration of the pixel circuit P, the drain electrode D of the driving transistor 121 is connected to the power supply whereas the source electrode S of the driving transistor 121 is connected to the anode electrode of the organic EL device 127. With the lapse of time, the Iel–Vel characteristic of the organic EL device 127 deteriorates as described above and the anode-cathode voltage Vel changes by a difference of (Vel2−Vel1) shown in the diagram of FIG. 3B even if the light-emission current Iel remains unchanged. The change of the I-V characteristic of the organic EL device 127 also changes the position of an operating point shown in the diagram of FIG. 3A and the voltage appearing on the source electrode S of the driving transistor 121 even if the voltage applied to the gate electrode G of the driving transistor 121 remains the same. Thus, the gate-source voltage Vgs of the driving transistor 121 also inevitably changes. Since the magnitude of the driving current Ids is determined by the gate-source voltage Vgs of the driving transistor 121 as is obvious from Eq. (1) serving as a characteristic equation, the magnitude of the driving current Ids also unavoidably changes even if the voltage Vg applied to the gate electrode G of the driving transistor 121 remains the same. Thus, the light-emission current Iel flowing through the organic EL device 127 also unavoidably changes, undesirably causing the luminance of light emitted by the organic EL device 127 to change with the lapse of time.

As described above, in the pixel circuit P having the second typical comparison configuration, the electric potential appearing on the anode electrode of the organic EL device 127 serving as a typical light emitting device changes with the lapse of time due to changes of the Iel–Vel characteristic of the organic EL device 127. The change of the electric potential appearing on the anode electrode of the organic EL device 127 is observed as a change of the gate-source voltage Vgs of the driving transistor 121. In turn, the change of the gate-source voltage Vgs of the driving transistor 121 causes a change in drain current or a change in driving current Ids. The change in driving current Ids causes a luminance change which varies from pixel to pixel and also varies in accordance with the length of the lapsing time. As a result, the quality of the image deteriorates.

<V-I Characteristic of the Driving Transistor>

In addition, if the characteristic of the driving transistor 121 varies from pixel to pixel, the characteristic variations have an effect on the driving current Ids flowing through the driving transistor 121 as is obvious from Eq. (1). For example, if the mobility μ and/or threshold voltage Vth of the driving transistor 121 vary from pixel to pixel or change with the lapse of time, the driving current Ids flowing through the driving transistor 121 also varies from pixel to pixel or changes with the lapse of time even if the gate-source voltage Vgs is sustained at a constant magnitude. As a result, the luminance of light emitted by the organic EL device 127 also varies from pixel to pixel or changes with the lapse of time.

For example, the characteristic of the driving transistor 121 employed in the pixel circuit P may vary from pixel to pixel due to variations of the process of manufacturing the driving transistor 121. In turn, the variations in characteristic give rise to variations in drain current or variations in driving current Ids from pixel to pixel even if the driving transistor 121 is operating in a saturated region and even if the gate-source voltage Vgs is sustained at a magnitude uniform for all the pixel circuits P. The variations in drain current or variations in driving current Ids appear as variations of the luminance of light emitted by the organic EL device 127 from pixel to pixel. It is to be noted that the characteristic of the driving transistor 121 includes the characteristics the mobility μ and threshold voltage Vth of the driving transistor 121.

As described earlier, the driving current Ids (or the drain current) of the driving transistor 121 operating in a saturated region is expressed by Eq. (1). The threshold voltage Vth of the driving transistor 121 may vary from pixel to pixel. If the threshold voltage Vth of the driving transistor 121 varies from pixel to pixel, the driving current Ids also varies from pixel to pixel as is obvious from Eq. (1) even if the gate-source voltage Vgs is sustained at a magnitude uniform for all the pixel circuits P. That is to say, unless a countermeasure against the variations in threshold voltage Vth from pixel to pixel is taken, the driving current Ids1 generated by a driving transistor 121 which has a threshold voltage of Vth1 and receives a gate-source voltage Vgs will be undesirably different from the driving current Ids2 generated by another driving transistor 121 which has a threshold voltage of Vth2 different from the threshold voltage of Vth1 and receives the same gate-source voltage Vgs.

By the same token, the mobility μ of the driving transistor 121 may vary from pixel to pixel. If the mobility μ of the driving transistor 121 varies from pixel to pixel, the driving current Ids also varies from pixel to pixel as is obvious from Eq. (1) even if the gate-source voltage Vgs is sustained at a magnitude uniform for all the pixel circuits P. That is to say, unless a countermeasure against the variations in mobility μ from pixel to pixel is taken, the driving current Ids1 generated by a driving transistor 121 which has a mobility of μ1 and receives a gate-source voltage Vgs will be undesirably different from the driving current Ids2 generated by another driving transistor 121 which has a mobility of μ2 different from the mobility of μ1 and receives the same gate-source voltage Vgs.

If the Vin-Ids characteristic varies much due to large variations in threshold voltage Vth and/or mobility μ from pixel to pixel where reference notation Vin denotes the high-level electric potential of a video signal Vsig applied to the gate electrode G of the driving transistor 121, the driving current Ids and, thus, the luminance of light emitted by the organic EL device 127 also vary as well from pixel to pixel even if the same signal amplitude ΔVin is applied to driving transistors 121 of the pixel circuits P. As a result, screen-luminance uniformity cannot be obtained. This is because, if the threshold voltage Vth and/or mobility μ of the driving transistor 121 employed in the pixel circuit P vary from pixel to pixel, the driving current Ids also varies from pixel to pixel in accordance with Eq. (1) and the luminance of the emitted light also varies from pixel to pixel.

<Concept of Threshold-Voltage and Mobility Compensations>

By setting timings to carry out a threshold-voltage compensation function and a mobility compensation function as counter measures against the variations in threshold voltage and variations in mobility respectively, effects of the variations can be repressed. Thus, screen-luminance uniformity can be obtained. The timings to carry out a threshold-voltage compensation function and a mobility compensation function will be described later in detail.

In a threshold-voltage compensation operation and a mobility compensation operation, which are carried out in accordance with this embodiment, a write gain to be described in detail later can be assumed to have an ideal value of 1. With the write gain assumed to have an ideal value of 1, the gate-source voltage Vgs applied to the driving transistor 121 in a light emission period is expressed by an expression of "Vin+Vth−ΔV" where reference notation Vin denotes the high-level electric potential of the video signal Vsig as described above whereas reference notations Vth and ΔV used in the expression denote parameters of the threshold-voltage compensation operation and the mobility compensation operation respectively. The magnitude of the parameter Vth of the threshold-voltage compensation operation is equal to the magnitude of the threshold voltage Vth of the driving transistor 121. The parameter Vth of the threshold-voltage compensation operation is a parameter for compensating the driving transistor 121 for variations of the threshold voltage Vth of the driving transistor 121. On the other hand, serving as a parameter for compensating the driving transistor 121 for variations of the mobility μ of the driving transistor 121, the parameter ΔV of the mobility compensation operation has a magnitude set as described below. By carrying out the threshold-voltage compensation operation and the mobility compensation operation, the driving current Ids can be made independent of variations and changes in threshold voltage Vth as well as variations and changes in mobility μ. As a result, even if the threshold voltage Vth and/or the mobility μ vary due to variations in manufacturing process or change with the lapse of time, the driving current Ids can be sustained at a constant magnitude, given a constant gate-source voltage Vgs applied to the driving transistor 121, so that the luminance of light emitted by the organic EL device 127 can also be sustained at a constant level.

The mobility compensation process is carried out to increase the parameter $\Delta V$ of the mobility compensation operation to a large value $\Delta V1$ for a driving transistor 121 having a large mobility $\mu1$ or decrease the parameter $\Delta V$ of the mobility compensation operation to a small value $\Delta V2$ for a driving transistor 121 having a small mobility $\mu2$. Thus, the parameter $\Delta V$ of the mobility compensation operation is used as a negative-feedback quantity proportional to the mobility $\mu$ of the driving transistor 121. For this reason, the parameter $\Delta V$ of the mobility compensation operation is also referred to as a negative-feedback quantity $\Delta V$.

<Pixel Circuit According to the Embodiment>

Figure 5:
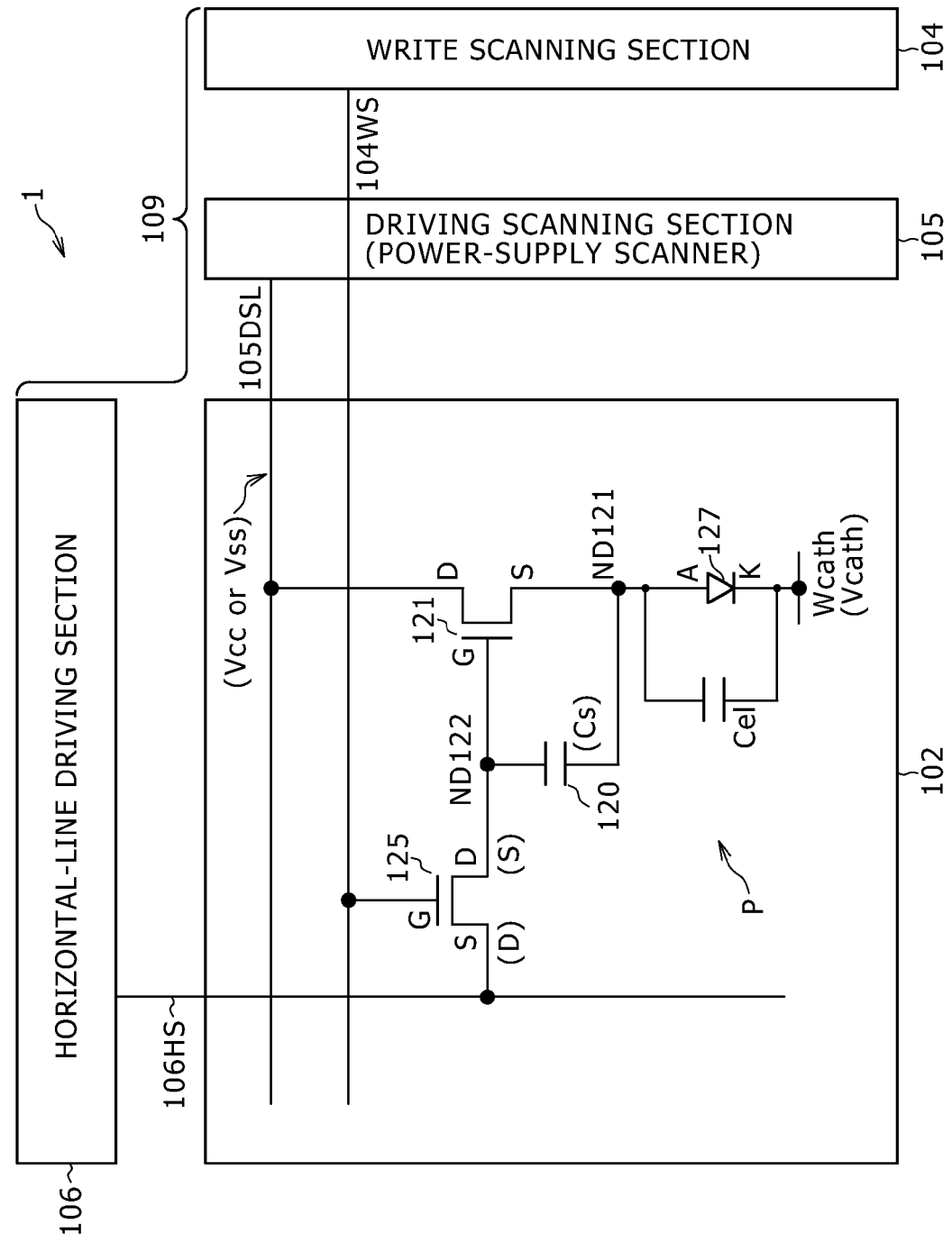
FIG. 5 is a diagram showing the pixel circuit according to this embodiment.

FIG. 5 is a diagram showing the pixel circuit P according to this embodiment. It is to be noted that the diagram of FIG. 5 also shows the wire scanning section 104 and the driving scanning section 105 of the vertical-direction driving section 103 and the horizontal-direction driving section 106, which are located on peripheries of the pixel array section 102 placed on the substrate 101 of the display panel section 100. The configuration of the pixel circuit P according to this embodiment is based on an Nch-type FET serving as the driving transistor 121. In addition, the pixel circuit P according to this embodiment also includes a first driving-signal stabilization circuit for repressing changes caused by deteriorations of the organic EL device 127 with the lapse of time to appear as changes of the driving current Ids flowing to the organic EL device 127. The first driving-signal stabilization circuit is a circuit for compensating the pixel circuit P for changes occurring with the lapse of time to appear as changes of the current-voltage characteristic of the organic EL device 127 serving as a typical electro-optical device in order to sustain the driving current Ids at a constant magnitude, given a constant gate-source voltage Vgs applied to the driving transistor 121.

The first driving-signal stabilizing circuit adopts a driving method for sustaining the driving current Ids at a constant magnitude, given a constant gate-source voltage Vgs applied to the driving transistor 121, by carrying out a threshold-voltage compensation and a mobility compensation function in order to get rid of driving-current variations caused by variations of the characteristic of the driving transistor 121. The variations of the characteristic of the driving transistor 121 are variations of the threshold voltage and mobility of the driving transistor 121. In accordance with the driving method for repressing effects exhibited by the driving current Ids as effects caused by variations of the characteristic of the driving transistor 121, that is, variations of the threshold voltage and mobility of the driving transistor 121, while the pixel circuit P having the 2TR-driven configuration is being used as it is to serve as the first driving-signal stabilizing circuit, a countermeasure against the variations of the characteristic of the driving transistor 121 is taken by devising timings to drive the driving transistor 121 and the sampling transistor 125. Since the 2TR-driven configuration is simple and the number of devices as well as the number of wires are small, the fineness of the pixel circuit P can be improved and, in addition to the improved fineness, the video signal Vsig can be sampled without causing deteriorations. Thus, a good quality of the image can be obtained.

The wiring connections of the signal holding capacitor 120 in the pixel circuit P according to the embodiment are different from those of the pixel circuit P in the second typical comparison configuration. That is to say, the signal holding capacitor 120 is connected to other components in the pixel circuit P according to the embodiment so as to form a bootstrap circuit functioning as a typical second driving-signal stabilization circuit. The bootstrap circuit functioning as a typical second driving-signal stabilization circuit is a circuit for getting rid of driving-current changes caused by aging deteriorations. In other words, the signal holding capacitor 120 is wired in the pixel circuit P according to the embodiment so as to carry out the functions of the bootstrap circuit serving as the typical second driving-signal stabilization circuit for sustaining the driving current Ids at a constant magnitude, even if the current-voltage characteristic of the organic EL device 127 changes with the lapse of time.

To put it concretely, as shown in the diagram of FIG. 5, the pixel circuit P according to the embodiment employs the Nch-type driving transistor 121, the Nch-type sampling transistor 125 and the organic EL device 127 serving as a typical electro-optical device which emits light when a driving current Ids is flowing thereto. Since the organic EL device 127 generally has a rectification characteristic, the organic EL device 127 is shown by making use of the symbol of a diode. It is to be noted that the organic EL device 127 has a parasitic capacitor Cel. In the diagram of FIG. 5, the parasitic capacitor Cel is shown as a capacitor connected in parallel to the organic EL device 127 which is represented by the symbol of a diode.

The signal holding capacitor 120 is connected between the source and gate electrodes of the driving transistor 121. The source and gate electrodes of the driving transistor 121 serve as nodes ND121 and ND122 respectively. The source electrode of the driving transistor 121 is also connected to the anode electrode A of the organic EL device 127. The signal holding capacitor 120 also serves as a bootstrap capacitor. A cathode electric potential Vcath used as a reference electric potential is supplied to the cathode electrode K of the organic EL device 127. The cathode electric potential Vcath used as a reference electric potential is asserted on a cathode wire Wcath which serves the ground line GND common to all pixel circuits P.

The gate electrode of the sampling transistor 125 is connected to the write scanning section 104 by a write scanning line 104WS whereas the drain electrode of the sampling transistor 125 is connected to the horizontal-line driving section 106 by a video-signal line 106HS. The source electrode of the sampling transistor 125 is connected to the gate electrode of the driving transistor 121. As described above, the gate electrode of the driving transistor 121 serves as the node ND122. The write scanning section 104 supplies an active-high write driving pulse WS to the gate electrode of the sampling transistor 125. The sampling transistor 125 can be connected by swapping the source and drain electrodes with each other. In addition, the sampling transistor 125 can be used as a depletion-type transistor or an enhancement-type transistor.

The drain electrode of the driving transistor 121 is connected to the driving scanning section 105 by a power-supply providing line 105DSL. The power-supply providing line 105DSL is a line which has a capability of supplying a power generated by the driving scanning section 105 to the driving transistor 121. To put it concretely, the driving scanning section 105 employs a power-supply voltage switching circuit for switching a power-supply driving pulse DSL supplied to the drain electrode of the driving transistor 121 from a high-level first electric potential Vcc to a low-level second electric potential Vss or vice versa. In the following description, the second electric potential Vss is also referred to as a initialization electric potential Vini. In actuality, a power-supply driving pulse DSL supplied to the drain electrode of the driving transistor 121 through the power-supply providing line 105DSL to serve as a pulse for driving the drain electrode has two levels, that is, a high level set at the first electric potential Vcc and a low level set at the second electric potential Vss. By supplying the second electric potential Vss to the drain electrode of the driving transistor 121, it is possible to drive the pixel circuit P to carry out a preparatory operation preparing for a threshold-voltage compensation operation prior to the threshold-voltage compensation operation.

The second electric potential Vss is an electric potential sufficiently lower than an aforementioned offset electric potential Vofs which is a reference electric potential of a video signal Vsig appearing on the video-signal line 106HS. To put it concretely, the low-level second electric potential Vss appearing on the power-supply providing line 105DSL is set at such a value that the gate-source voltage Vgs of the driving transistor 121 is greater than the threshold voltage Vth of the driving transistor 121. The gate-source voltage Vgs is a difference in electric potential between the gate and source electrodes of the driving transistor 121. It is to be noted that the offset electric potential Vofs is applied to the video-signal line 106HS during an initialization operation prior to a threshold-voltage compensation operation and also used for pre-charging the video-signal line 106HS in advance.

In the pixel circuit P described above, in an operation to drive the organic EL device 127, the first electric potential Vcc is supplied to the drain electrode of the driving transistor 121 and, since the source electrode S of the driving transistor 121 is connected to the anode electrode of the organic EL device 127, as a whole, the driving transistor 121 and the organic EL device 127 form a source follower.

The pixel circuit P described above adopts the so-called 2TR driving configuration employing the driving transistor 121 and the switching transistor 125 (or the sampling transistor 125) used for scanning operations. In addition, by properly setting timings of the power-supply driving pulse DSL for supplying the first electric potential Vcc or the second electric potential Vss to the driving transistor 121 as well as timings of the write driving pulse WS to put the sampling transistor 125 in a turned-on and turned-off states, it is possible to get rid of effects of aging deteriorations of the organic EL device 127 and/or effects of variations of the characteristic of the driving transistor 121 on the driving current Ids. As described earlier, the variations of the characteristic of the driving transistor 121 are typically variations of the threshold voltage and mobility of the driving transistor 121.

The write scanning section 104, the driving scanning section 105 and the horizontal-direction driving section 106 are provided on peripheries of the pixel array section 102 to serve as sections for driving the pixel circuit P. The write scanning section 104, the driving scanning section 105 and the horizontal-direction driving section 106 form a control section 109. The control section 109 functions as a driving-signal stabilization circuit for properly setting driving timings so as to sustain the driving current Ids generated by the driving transistor 121 at a constant magnitude, given a constant gate-source voltage Vgs applied to the driving transistor 121. To put it concretely, first of all, it is desirable to execute control of operating the write scanning section 104 to put the sampling transistor 125 in a turned-off state in order to stop an operation to supply the video signal Vsig to the gate electrode (that is, the control input terminal) of the driving transistor 121 at a point of time information corresponding to the signal amplitude ΔVin has been stored in the signal holding capacitor 120. With the sampling transistor 125 put in a turned-off state, a bootstrap operation takes place by virtue of the coupling effect of the signal holding capacitor 120 as an operation in which the electric potential appearing on the control input terminal of the driving transistor 121 changes in a manner of being interlocked with the electric potential appearing on the source gate (that is, the output terminal of the driving transistor 121).

It is desirable to operate the control section 109 to execute control leading to the bootstrap operation also in an initial part of a light emission start lagging behind the end of the sampling operation. That is to say, in a state of supplying the high-level electric potential Vin of the video signal Vsig to the sampling transistor 125, the sampling transistor 125 is put in a turned-on state and then put in a turned-off state so that the difference in electric potential between the control input terminal and output terminal of the driving transistor 121 is sustained at a constant magnitude.

In addition, it is desirable to operate the control section 109 to execute control leading to execution of a bootstrap operation in a light emission period shown in the timing diagram of FIG. 6 as a period (G) so that an operation to compensate the pixel circuit P for aging deteriorations of the characteristic the organic EL device 127 serving as an electro-optical device is implemented by execution of the bootstrap operation. In order to implement such a compensation period, in a period during which the driving current Ids according to information stored in the signal holding capacitor 120 is flowing to the organic EL device 127 serving as an electro-optical device, the sampling transistor 125 is put in a continuous turned-off state in advance so that the difference in electric potential between the control input terminal and output terminal of the driving transistor 121 can be sustained at a constant magnitude in order to implement the operation to compensate the pixel circuit P for aging deteriorations of the characteristic the organic EL device 127. By letting the bootstrap operation take place in a light emission period as the bootstrap operation based on the coupling effect of the signal holding capacitor 120, the difference in electric potential between the control input terminal and output terminal of the driving transistor 121 can be sustained at a constant magnitude by virtue of the bootstrap operation based on the coupling effect of the signal holding capacitor 120 even if the current-voltage characteristic of the organic EL device 127 changes with the lapse of time. Thus, the luminance of light emitted by the organic EL device 127 can be sustained at a constant magnitude all the time.

On top of that, it is desirable to operate the control section 109 to execute control of carrying out a threshold-voltage compensation operation for holding a voltage corresponding to the threshold voltage Vth of the driving transistor 121 in the signal holding capacitor 120 by putting the sampling transistor 125 in a turned-on state during a time band in which the offset electric potential Vofs is being supplied to the input terminal of the sampling transistor 125. Typically, the source electrode of the sampling transistor 125 is used as the input terminal of the sampling transistor 125. If necessary, the threshold-voltage compensation operation is carried out repeatedly in a plurality of horizontal periods leading ahead of an operation to store information corresponding to the signal amplitude ΔVin in the signal holding capacitor 120. By carrying out the threshold-voltage compensation operation repeatedly, the voltage corresponding to the threshold voltage Vth of the driving transistor 121 can be held in the signal holding capacitor 120 with a high degree of reliability.

In addition, it is desirable to operate the control section 109 to execute control of putting the sampling transistor 125 in a turned-on state in order to carry out a preparatory operation preparing for a threshold-voltage compensation operation during a time band, in which the offset electric potential Vofs is being supplied to the input terminal of the sampling transistor 125, prior to the threshold-voltage compensation operation. The preparatory operation preparing for a threshold-voltage compensation operation includes a discharging operation and an initialization operation. That is to say, prior to the threshold-voltage compensation operation, an electric potential appearing between the control input terminal and output terminal of the driving transistor 121 is initialized. To put it in detail, a difference in electric potential between the terminals of the signal holding capacitor 120 which is connected between the control input terminal and output terminal of the driving transistor 121 is set at a level at least equal to the threshold voltage Vth of the driving transistor 121.

<Operations of the Pixel Circuit According to the Embodiment>

FIG. 6 is a timing diagram showing a plurality of explanatory timing charts referred to in description of basic driving timings of the embodiment shown in the diagram of FIG. 5 as an embodiment implementing the pixel circuit P. Each of FIGS. 7A to 7G is an explanatory circuit diagram referred to in description of an equivalent circuit of the pixel circuit P and the operation of the equivalent circuit in one of periods (A) to (G) shown at the bottom of the timing diagram of FIG. 6.

The timing diagram of FIG. 6 has the horizontal axis serving as a time axis common to all the timing charts. The timing charts of the timing diagram of FIG. 6 show electric-potential changes of the write driving pulse WS appearing on the write driving line 104WS, the power-supply driving pulse DSL appearing on the power-supply providing line 105DSL and the video signal Vsig appearing on the video-signal line 106HS. In addition, the timing diagram of FIG. 6 also shows changes of the gate voltage Vg appearing on the gate electrode of every driving transistor 121 on a pixel row and the source voltage Vs appearing on the source electrode of the driving transistor 121. The changes of the gate voltage Vg and the source voltage Vs occur in parallel to the electric-potential changes of the write driving pulse WS, the power-supply driving pulse DSL and the video signal Vsig.

In the following description, unless otherwise specified, the write gain described below is assumed to have an ideal value of 1 in order to make the explanation easy to understand. Thus, the following description explains that information corresponding to the magnitude of the signal amplitude ΔVin is written, stored or held in the signal holding capacitor 120. If the write gain is smaller than the ideal value of 1, information with an amount smaller than the magnitude of the signal amplitude ΔVin is written, stored or held in the signal holding capacitor 120. That is to say, information corresponding to a product obtained as a result of multiplying the magnitude of the signal amplitude ΔVin by the write gain is written, stored or held in the signal holding capacitor 120.

By the way, reference notation Ginput is used in this patent specification to denote the write gain which is defined as a ratio of the amount of information actually stored in the signal holding capacitor 120 to the signal amplitude ΔVin. The write gain Ginput is explained concretely as follows. Instead of being stored merely in the signal holding capacitor 120, the signal amplitude ΔVin is actually held in a capacitor series circuit. The capacitor series circuit includes a total capacitor C1 and a capacitor C2 which are connected to each other in series. The total capacitor C1 represents the signal holding capacitor 120 and a parasitic capacitor which forms a parallel circuit in conjunction with the signal holding capacitor 120. On the other hand, the parasitic capacitor C2 is a parasitic capacitor which forms a series circuit in conjunction with the signal holding capacitor 120. The write gain Ginput is expressed as follows:

$$Ginput = C2/(C1+C2) = 1 - C1/(C1+C2) = 1 - g$$

In the above equation, reference notation g denotes a quantity expressed as follows:

$$g = C1/(C1+C2)$$

In addition, in the following simplified description, unless otherwise specified, a bootstrap gain Gbst is assumed to also have an ideal value of 1 in order to make the explanation easy to understand. In a pixel circuit P including the driving transistor 121 and the signal holding capacitor 120 connected between the gate and source electrodes of the driving transistor 121, with the sampling transistor 125 put in a turned-off state, a bootstrap operation may take place as an operation in which the electric potential appearing on the gate electrode of the driving transistor 121 changes in a manner of being interlocked with the electric potential appearing on the source gate of the driving transistor 121 due to the coupling effect of the signal holding capacitor 120. The bootstrap gain Gbst is defined as the ratio of an increase of the gate voltage Vg appearing on the gate electrode in a bootstrap operation to an increase of the source voltage Vs appearing on the source electrode in the same bootstrap operation. Thus, the bootstrap gain Gbst indicates the power of the bootstrap operation. To put it concretely, the bootstrap gain Gbst can be expressed by the following equation:

$$Gbst = (Cs+Cgs)/(Cs+Cgs+Cgd+Cws)$$

In the above equation, reference notation Cs denotes the capacitance of the signal holding capacitor 120, reference notation Cgs denotes the capacitance of a parasitic capacitor C121gs existing between the gate and source electrodes of the driving transistor 121, reference notation Cgd denotes the capacitance of a parasitic capacitor C121gd existing between the gate and drain electrodes of the driving transistor 121 and reference notation Cws denotes the capacitance of a parasitic capacitor C125gs existing between the gate and source electrodes of the sampling transistor 125.

Basically, the write scanning line 104WS is subjected to the same operation periodically at intervals each equal to one horizontal scanning period denoted by reference notation 1H in the timing diagram of FIG. 6. By the same token, the power-supply providing line 105DSL is also subjected to the same operation periodically at intervals each equal to one horizontal scanning period. The early part of the horizontal scanning period 1H is the so-called an ineffective period of the video signal Vsig whereas the later part of the horizontal scanning period 1H is the so-called an effective period of the video signal Vsig. With timings according to the embodiment, the video signal Vsig asserted on the video-signal line 106HS is set at the offset electric potential Vofs in the ineffective period and set at the high-level electric potential Vin (=Vofs+ΔVin) in the effective period where reference notation ΔVin denotes the signal amplitude mentioned before. In this embodiment, the one horizontal period is taken as a processing cycle in which the threshold-voltage compensation operation is carried out once. In actuality, however, the threshold-voltage compensation operation can be carried out a plurality of times.

The one horizontal period becomes a processing cycle of the threshold-voltage compensation operation because, during the one horizontal period, for every pixel row, prior to the threshold-voltage compensation operation which is carried out before the sampling transistor 125 samples information corresponding to the signal amplitude ΔV and stores (or writes) the sampled information in the signal holding capacitor 120, an initialization operation is performed. In the initialization operation, the power-supply driving pulse DSL asserted on power-supply providing line 105DSL is set at the second electric potential Vss and the voltage appearing on the gate electrode of the driving transistor 121 is set at the offset electric potential Vofs. The electric potential appearing on the source electrode of the driving transistor 121 is also set at the second electric potential Vss. Then, in a state of setting the power-supply driving pulse DSL asserted on power-supply providing line 105DSL at the first electric potential Vcc and during a time band in which the offset electric potential Vofs is appearing on the video-signal line 106HS, the sampling transistor is conducted. The threshold-voltage compensation operation is carried out in order to hold a voltage corresponding to the threshold voltage Vth of the driving transistor 121.

Since the period (D) shown in the timing diagram of FIG. 6 as the period of the threshold-voltage compensation operation is terminated before the end of the one horizontal period, the period of the threshold-voltage compensation operation is naturally shorter than the one horizontal period. Thus, there may be a case in which the voltage accurately corresponding to the threshold voltage Vth of the driving transistor 121 cannot be held in the signal holding capacitor 120 by carrying out in the short period of the threshold-voltage compensation operation for some reasons including a reason relevant to a relation between the capacitance Cs of the signal holding capacitor 120 and the magnitude of the second electric potential Vss. In order to solve this problem, the threshold-voltage compensation operation is carried out a plurality of times in this embodiment. That is to say, in each of a plurality of horizontal periods leading ahead of the operation to sample the information corresponding to the signal amplitude ΔVin and store (or write) the sampled information in the signal holding capacitor 120, the threshold-voltage compensation operation is carried out. Thus, the threshold-voltage compensation operation is carried out a plurality of times in the same plurality of respective horizontal periods leading ahead of the information sampling and storing operation in order to hold the voltage corresponding to the threshold voltage Vth of the driving transistor 121 in the signal holding capacitor 120 with a high degree of reliability.

Figure 7A:
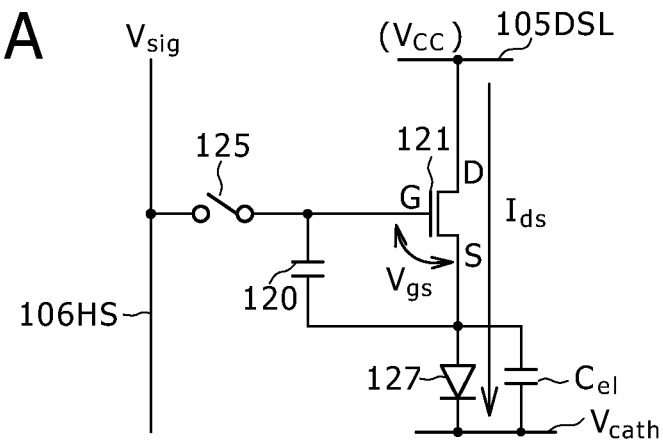
FIG. 7A is an explanatory circuit diagram to be referred to in description of an equivalent circuit and operating state of the pixel circuit in a period (A) shown in the timing charts of FIG. 6.

First of all, the following description starts with an explanation of the light emission period in which the power-supply driving pulse DSL is set at the first electric potential Vcc, the video signal Vsig is set at the high-level electric potential Vin and the sampling transistor 125 is put in a turned-off state as shown in a circuit diagram of FIG. 7A by setting the write driving pulse WS at the low level WS_L. In the light emission period, the driving transistor 121 is set to operate in a saturated region. Thus, the driving current Ids flowing from the driving transistor 121 to the organic EL device 127 has a magnitude determined by the gate-source voltage Vgs of the driving transistor 121 in accordance with Eq. (1).

Figure 7B:
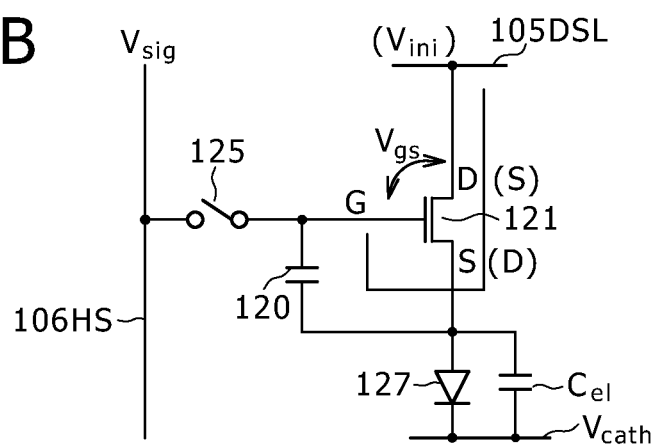
FIG. 7B is an explanatory circuit diagram to be referred to in description of an equivalent circuit and operating state of the pixel circuit in a period (B) shown in the timing charts of FIG. 6.

Then, when the power-supply driving pulse DSL asserted on the power-supply providing line 105DSL is changed from the first electric potential Vcc to the second electric potential Vss also referred to as the initialization electric potential Vini as shown in a circuit diagram of FIG. 7B, the power-supply driving pulse DSL becomes the source of the driving transistor 121 and the source voltage Vs of the driving transistor 121 becomes all but equal to the initialization electric potential Vini which satisfies the following relation of Vini (<Vth(el)+Vcath) where reference notation Vth(el) denotes the threshold voltage of the organic EL device 127 and reference notation Vcath denotes the cathode electric potential Vcath. With the source voltage Vs of the driving transistor 121 becoming all but equal to the initialization electric potential Vini, the organic EL device 127 ceases to emit light.

Figure 7C:
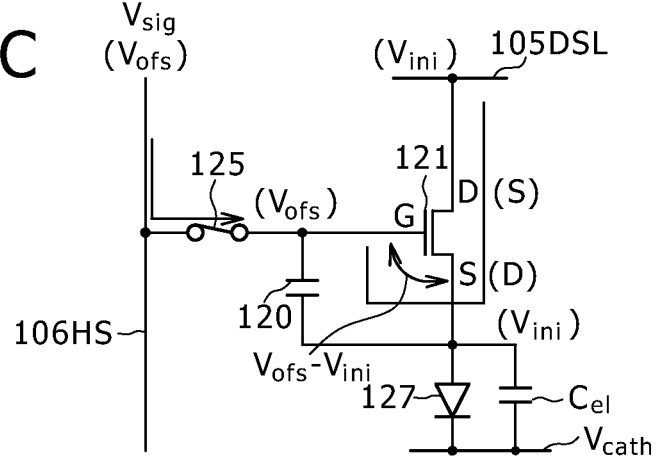
FIG. 7C is an explanatory circuit diagram to be referred to in description of an equivalent circuit and operating state of the pixel circuit in a period (C) shown in the timing charts of FIG. 6.

As shown in a circuit diagram of FIG. 7C, when the write driving pulse WS asserted on the write scanning line 104WS is changed from the low level WS_L to the high level WS_H in order to put the sampling transistor 125 in a turned-on state, the offset electric potential Vofs is supplied to the gate electrode of the driving transistor 121 and the source voltage Vs of the driving transistor 121 becomes equal to the initialization electric potential Vini as shown in a circuit diagram of FIG. 7C. Thus, at that time, the gate-source voltage Vgs of the driving transistor 121 becomes equal to (Vofs−Vini). If (Vofs−Vini) is not greater than the threshold voltage Vth of the driving transistor 121, the threshold-voltage compensation operation cannot be carried out. It is thus necessary to set the voltages at such values that the relation of (Vofs−Vini)>Vth is satisfied. In the period (C) shown in the diagram of FIG. 6 as a period corresponding to the circuit diagram of FIG. 7C, the gate electric potential Vg appearing on the gate electrode of the driving transistor 121 is established at the offset electric potential Vofs and the source electric potential Vs appearing on the source electrode of the driving transistor 121 is established at the initialization electric potential Vini so that the gate-source voltage Vgs (=Vofs−Vini) is greater than the threshold voltage Vth of the driving transistor 121. The period (C) is referred to as the initialization operation described above.

Figure 7D:
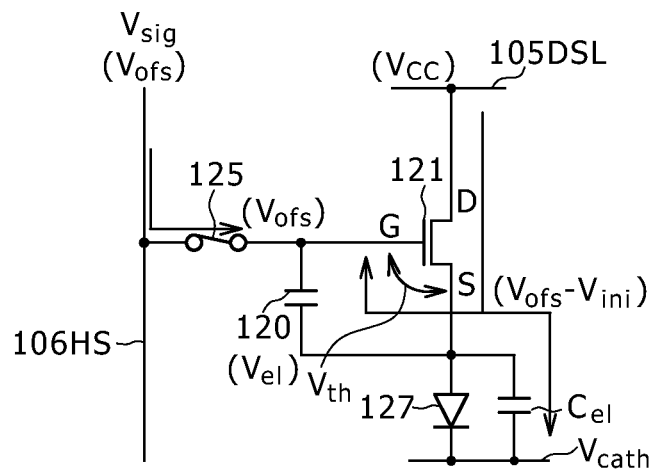
FIG. 7D is an explanatory circuit diagram to be referred to in description of an equivalent circuit and operating state of the pixel circuit in a period (D) shown in the timing charts of FIG. 6.

Then, the power-supply driving pulse DSL appearing on the power-supply providing line 105DSL is changed from the initialization electric potential Vini to the first electric potential Vcc as shown in a circuit diagram of FIG. 7D, putting the driving transistor 121 in a turned-on state. With the driving transistor 121 put in a turned-on state, the driving current Ids is flowing through the driving transistor 121, electrically charging the parasitic capacitor Cel of the organic EL device 127. Thus, the source voltage Vs of the driving transistor 121 rises and, after the lapse of time determined in advance, the gate-source voltage Vgs of the driving transistor 121 becomes equal to the threshold voltage Vth of the driving transistor 121, putting the driving transistor 121 in a turned-off state. This operation to set the driving transistor 121 at the threshold voltage Vth of the driving transistor 121 is referred to as the threshold-voltage compensation operation.

Figure 7E:
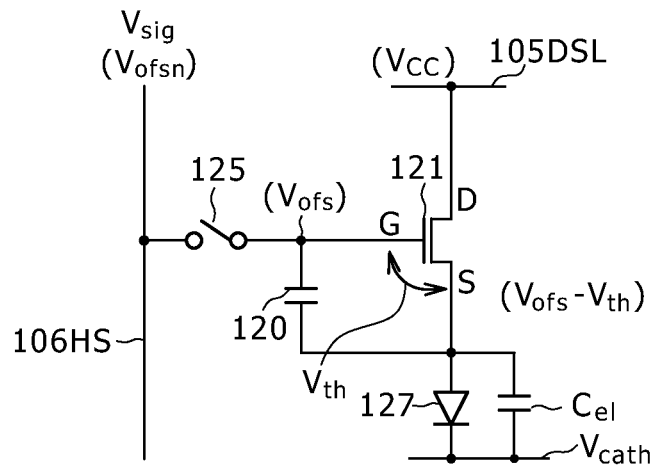
FIG. 7E is an explanatory circuit diagram to be referred to in description of an equivalent circuit and operating state of the pixel circuit in a period (E) shown in the timing charts of FIG. 6.

The write driving pulse WS appearing on the write scanning line 104WS is changed from the high level WS_H to the low level WS_L in order to put the sampling transistor 125 in a turned-off state as shown in a circuit diagram of FIG. 7E. With the sampling transistor 125 put in a turned-off state, the gate electric potential Vg appearing on the gate electrode of the driving transistor 121 is put in a floating state but, since the gate-source voltage Vgs of the driving transistor 121 is equal to the threshold voltage Vth, the driving transistor 121 remains in a turned-off state, disallowing the driving current Ids to flow.

Figure 7F:
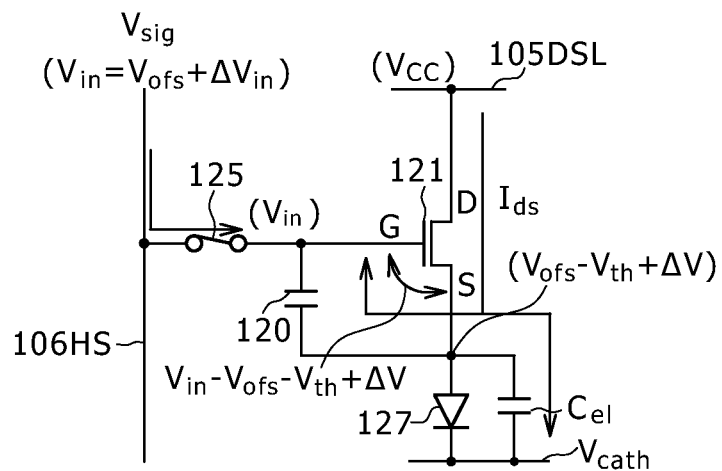
FIG. 7F is an explanatory circuit diagram to be referred to in description of an equivalent circuit and operating state of the pixel circuit in a period (F) shown in the timing charts of FIG. 6.

The period (F) serving as the signal electric-potential write period/a mobility compensation period is started when the write driving pulse WS asserted on the write scanning line 104WS is changed from the low level WS_L to the high level WS_H in order to put the sampling transistor 125 in a turned-on state as shown in a circuit diagram of FIG. 7F. As shown in a circuit diagram of FIG. 7F, during the period (F), the video signal Vsig asserted on the video-signal line 106HS has been changed from the offset electric potential Vofs to the high-level electric potential Vin, which is equal to (Vofs+ΔVin), as described above. Thus, an electric potential corresponding to ΔVin is added to the gate voltage Vg (or the gate-source voltage Vgs) appearing on the gate electrode of the driving transistor 121 to be stored in the signal holding capacitor 120 in the so-called signal electric-potential write operation. Since the gate-source voltage Vgs has been set at the threshold voltage Vth of the driving transistor 121 in the threshold-voltage compensation operation carried out in the period (D) as described above, the gate-source voltage Vgs becomes equal to (ΔVin+Vth) which is greater than the threshold voltage Vth of the driving transistor 121. In addition, the driving transistor 121 is put in a turned-on state whereas the driving current Ids flows from the power-supply providing line 105DSL to the signal holding capacitor 120 having a capacitance Cs and the parasitic capacitor Cel included in the organic EL device 127 as a capacitor having a capacitance Cel by way of the driving transistor 121. Thus, the source voltage Vs of the driving transistor 121 rises with the lapse of time.

Before supplying the high-level electric potential Vin to the gate electrode of the driving transistor 121 in the period (F), the gate-source voltage Vgs has been set at the threshold voltage Vth in advance. The driving current Ids flowing through the driving transistor 121 may reflect variations of the mobility μ of the driving transistor 121. To put it in detail, for a driving transistor 121 having a large mobility μ, the driving current Ids has a large magnitude and the source voltage Vs rises fast. For a driving transistor 121 having a small mobility μ, on the other hand, the driving current Ids has a small magnitude and the source voltage Vs rises slowly. The source voltage Vs of the driving transistor 121 rises by an electric-potential difference ΔV to reduce the gate-source voltage Vgs in a direction of compensating the driving transistor 121 for variations in mobility μ. After the lapse of certain time, the resulting gate-source voltage Vgs is approximately a voltage obtained as a result of the so-called mobility compensation operation of compensating the driving transistor 121 for variations in mobility μ. The period (F) is thus also the period of the mobility compensation operation of the driving transistor 121.

Figure 7G:
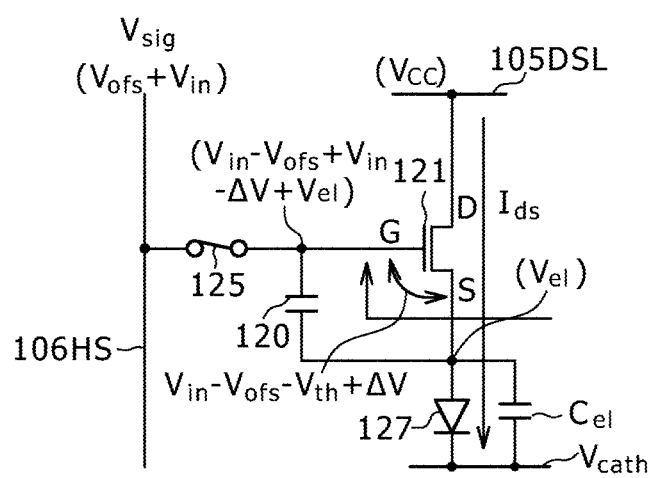
FIG. 7G is an explanatory circuit diagram to be referred to in description of an equivalent circuit and operating state of the pixel circuit in a period (G) shown in the timing charts of FIG. 6.

The write driving pulse WS asserted on the write scanning line 104WS is changed from the high level WS_H to the low level WS_L in order to put the sampling transistor 125 in a turned-off state and to make a transition to a period (G) serving as a light emission period in which the pixel circuit P is put in an operating state shown in the circuit diagram of FIG. 7G. Since the gate-source voltage Vgs of (Vin−Vofs+Vth−ΔV) is greater than the threshold voltage Vth of the driving transistor 121, that is, the relation of (Vin−Vofs+Vth−ΔV)>Vth holds true, the driving current Ids is flows, further raising the source voltage Vs of the driving transistor 121. Since the sampling transistor 125 has been put in a turned-off state causing the gate electrode of the driving transistor 121 to enter a floating state, however, a bootstrap operation occurs due to the coupling effect of the signal holding capacitor 120 while the source voltage Vs of the driving transistor 121 is rising. Thus, the gate voltage Vg of the driving transistor 121 is also rising in a manner of being interlocked with the source voltage Vs in the bootstrap operation. As a result, the gate-source voltage Vgs of the driving transistor 121 is sustained at (Vin−Vofs+Vth−ΔV), keeping a state of outputting a constant driving current Ids to the organic EL device 127 so that the organic EL device 127 emits light.

The driving current Ids can be expressed by Eq. (2) described below to serve as a relation between the driving current Ids and the gate-source voltage Vgs. Eq. (2) is derived from Eq. (1) given earlier as an equation representing the characteristic of the driving transistor 121 by assuming that the write gain has an ideal value of 1 and substituting an expression of (Vin−ΔV+Vth) into the expression on the right-hand side of Eq. (1) as a replacement for Vgs. Reference notation k used in the expression on the right-hand side of Eq. (2) denotes a quantity expressed as follows:

$$k=(1/2)(W/L)Cox$$

$$Ids=k\mu(Vgs-Vth)^2=k\mu(\Delta Vin-\Delta V)^2 \quad (2)$$

The term of the threshold voltage Vth disappears from Eq. (2) clearly indicating that the driving current Ids supplied to the organic EL device 127 is not dependent on the threshold voltage Vth of the driving transistor 121. Basically, the driving current Ids is determined by the high-level electric potential Vin. Strictly speaking, the driving current Ids is determined by the gate-source voltage Vgs which is a voltage stored in the signal holding capacitor 120 as a result of a sampling operation to sample the signal amplitude ΔVin. In other words, the organic EL device 127 emits light with a luminance according to the signal amplitude ΔVin. In the light emission state of the organic EL device 127, the voltage stored in the signal holding capacitor 120 as information determining the driving current Ids of the driving transistor 121 has also been corrected by the mobility compensation operation parameter ΔV which is used as the negative-feedback quantity cited above. The parameter ΔV of the mobility compensation operation works to just eliminate the effect of the mobility μ positioned at a coefficient term in the expression on the right-hand side of Eq. (2). Thus, the driving current Ids generated by the driving transistor 121 is essentially dependent only on the signal amplitude ΔVin.

That is to say, as a result of the operations carried out by the pixel circuit P as described above, the gate-source voltage Vgs appearing between the gate and source electrodes of the driving transistor 121 during the light emission period is determined by the expression of (Vin−Vofs+Vth−ΔV) which includes the term Vth serving as a parameter for compensating the driving transistor 121 for variations of the threshold voltage Vth of the driving transistor 121 and includes the term ΔV serving as a parameter for compensating the driving transistor 121 for variations of the mobility μ of the driving transistor 121. The expression of (Vin−Vofs+Vth−ΔV) is not affected by changes of the source voltage Vs of the driving transistor 121, that is, changes of the voltage appearing on the anode electrode of the organic EL device 127. This is because the gate voltage Vg of the driving transistor 121 also changes in a manner of being interlocked with the source voltage Vs of the driving transistor 121 during the bootstrap operation based on the coupling effect of the signal holding capacitor 120. By the way, the changes of the voltage appearing on the anode electrode of the organic EL device 127 are caused by changes of the I-V characteristic of the organic EL device 127 with the lapse of time. Thus, it is possible to get rid of variations of the characteristic of the driving transistor 121 and aging deteriorations of the organic EL device 127. That is to say, by driving the pixel circuit P to carry out operations accurately, it is possible to get rid of the variations of the characteristic of the driving transistor 121 and the aging deteriorations of the organic EL device 127.

<Problems>

Figure 8:
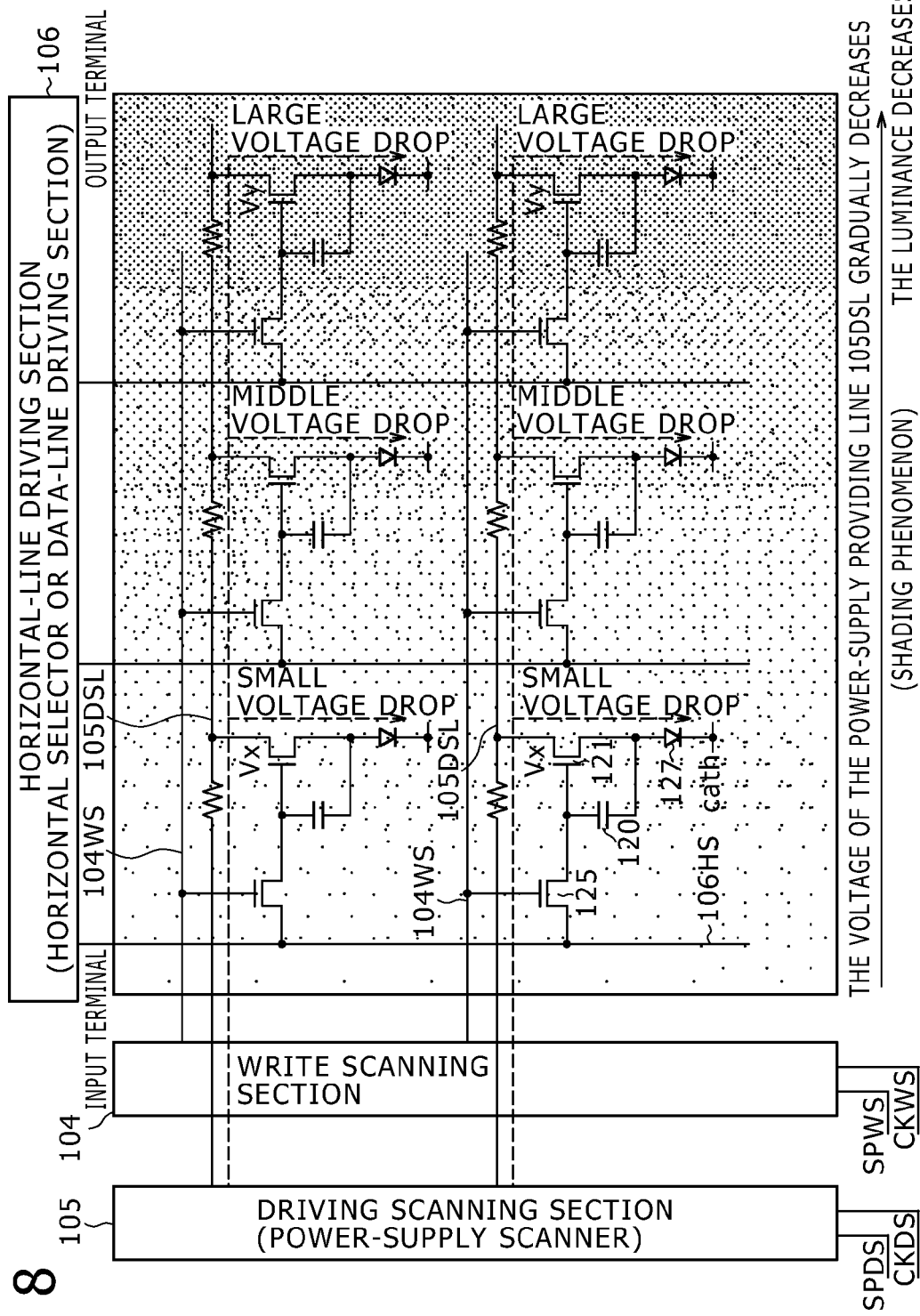
FIG. 8 is an explanatory diagram to be referred to in description of a problem caused by the wire resistance of a power-supply providing line serving as a power-supply line to appear as a problem raised in an operation to display an image at an all white display time.

FIGS. 8 and 9A to 9C are explanatory diagrams referred to in description of problems raised by the display panel section 100 according to the embodiment. To be more specific, FIG. 8 is an explanatory diagram referred to in description of a problem caused by the wire resistance of the power-supply providing line 105DSL serving as a power-supply line to appear as a problem raised in an operation to display an image at an all white display time. On the other hand, FIGS. 9A to 9C are explanatory diagrams each referred to in description of a problem caused by the wire resistance of the power-supply providing line 105DSL serving as a power-supply line to appear as a problem raised in an operation to display an image at a window pattern display time. It is to be noted that the explanatory diagrams of FIGS. 9A to 9C are also used for describing causes of the problems explained by referring to the explanatory diagrams of FIGS. 8 and 9A to 9C as causes attributed to a relation with an early effect of the transistors.

As shown in the explanatory diagram of FIG. 8, each of scanning lines Lscan is oriented in the horizontal direction. In the following description with reference to the explanatory diagram of FIG. 8, the power-supply providing line 105DSL used in the power-supply vertical-direction scanning operation is taken as a typical scanning line Lscan. It is thus necessary to consider a problem caused by the wire resistance of the power-supply providing line 105DSL.

As shown in the diagram of FIG. 5, the pixel circuit P is configured to employ two transistors, that is, the driving transistor 121 and the sampling transistor 125, as well as one capacitor, i.e., the signal holding capacitor 120. The pixel circuit P is driven to carry out a threshold-voltage compensation function, a mobility compensation function and a bootstrap function. In this case, the power-supply driving pulse DSL asserted on the power-supply providing line 105DSL serving as a power-supply providing line connected to the drain electrode of the driving transistor 121 is switched from the first electric potential Vcc to the second electric potential Vss also referred to as the initialization electric potential Vini or vice versa. As shown in the explanatory diagrams of FIG. 8 and FIG. 9A, the power-supply providing line 105DSL is oriented in the horizontal direction and the driving current Ids of each of pixel circuits P on the same pixel row as the power-supply providing line 105DSL flows to the cathode electric wire Wcath provided to serve as a line common to all pixel circuits P and to serve as a line for supplying a reference electric potential to all the pixel circuits P. Typically, the ground line GND is used as the cathode electric wire Vcath for supplying a reference electric potential of 0 to all the pixel circuits P.

In the configuration described above, a voltage drop on the side close to the control section 109 of the pixel array section 102 is smaller than a voltage drop on the side opposite to the side close to the control section 109 due to a difference in wire resistance between the scanning line Lscan stretched from the control section 109 to the pixel circuit P on the side close to the control section 109 and the scanning line Lscan stretched from the control section 109 to the pixel circuit P on the opposite side. The side close to the control section 109 is referred to the scanning-signal input edge side which is the panel left-edge side in the explanatory diagrams of FIGS. 8 and 9C. On the other hand, the side opposite to the side close to the control section 109 is referred to the scanning-signal output edge side which is the panel right-edge side in the explanatory diagrams of FIGS. 8 and 9C. Thus, the electric potential supplied to the drain electrode (that is, the power-supply providing terminal) of the driving transistor 121 on the scanning-signal output edge side is lower than the electric potential supplied to the drain electrode of the driving transistor 121 on the scanning-signal input edge side. That is to say, the longer the distance between the driving transistor 121 and the driving scanning section 105, the larger the wire resistance and, thus, the larger the voltage drop along the power-supply providing line 105DSL stretched to the driving transistor 121. Therefore, the longer the distance between the driving transistor 121 and the driving scanning section 105, the lower the electric potential supplied to the drain electrode (that is, the power-supply providing terminal) of the driving transistor 121. In the explanatory diagrams of FIGS. 8 and 9C, each of the wire resistances is shown as the symbol of a resistor.

In such a configuration, as the distance between the driving transistor 121 and the driving scanning section 105 gradually increases, the voltage applied between the drain and source electrodes of the driving transistor 121 gradually decreases. Thus, the driving transistor 121 is affected by the so-called early effect. If affected by the early effect, as the distance between the driving transistor 121 and the driving scanning section 105 gradually increases, the driving current Ids generated by the driving transistor 121 gradually decreases even if the method for getting rid of variations in characteristic as explained earlier by referring to the diagrams of FIGS. 6 and 7A to 7G is adopted.

The early effect causes a phenomenon varying in accordance with the display pattern to appear in the displayed image. FIG. 8 is a diagram referred to in description of phenomena which occur in the case of an all white display. In the case of an all white display, as the distance between the driving transistor 121 and the driving scanning section 105 gradually increases, the voltage drop along the power-supply providing line 105DSL stretched to the driving transistor 121 also gradually increases as well as described above. FIG. 9B is a diagram showing the characteristic of the driving transistor 121. As is obvious from the diagram of FIG. 9B, as the power-supply voltage appearing as an electric potential supplied to the drain electrode of the driving transistor 121 decreases, the driving current Ids representing the luminance of light emitted by the organic EL device 127 gradually decreases. Thus, in the case of an all white display, the luminance of light emitted by the organic EL device 127 gradually decreases even if a mechanism applying the method for getting rid of variations in characteristic as explained earlier by referring to the diagrams of FIGS. 6 and 7A to 7G is adopted. As a result, the luminance of light emitted by the organic EL device 127 gradually decreases as shown in the block diagram of FIG. 8, giving rise to the so-called shading phenomenon.

In addition, if the driving current Ids flowing through the driving transistor 121 in accordance with a video pattern varies, the power-supply voltage also changes from pixel circuit P to pixel circuit P along a pixel row oriented in the horizontal direction due to the wire resistance of the power-supply providing line 105DSL and the cathode electric wire Vcath which serve as power-supply lines. To put it in detail, the power-supply voltage is the drain-source voltage Vds applied between the drain and source electrodes of the driving transistor 121. In particular, the driving current Ids flows to the cathode electrode of the organic EL device 127 in every pixel circuit P on the same pixel column. Thus, the cathode electrode of every organic EL device 127 in every pixel circuit P on the same pixel column is floated at an electric-potential level higher than the ground electric potential GND by an electric-potential difference equal to a product Rcath X Ids_all where reference notation Rcath denotes the wire resistance of the cathode electric wire Wcath and reference notation Ids_all denotes the total of driving currents Ids each flowing to the cathode electrode of the organic EL device 127 in one of pixel circuits P on the same pixel column. As a result, the drain-source voltage Vds applied between the drain and source electrodes of the driving transistor 121 also changes as well.

As is obvious from the diagram of FIG. 9B, as the drain-source voltage Vds of the driving transistor 121 changes due to the early effect, the driving current Ids of the driving transistor 121 also changes even if the driving transistor 121 is operating in the saturated region and the gate-source voltage Vgs of the driving transistor 121 is sustained at a constant value. Typically, the changes of the driving current Ids of the driving transistor 121 are eventually recognized as horizontal-direction crosstalk in an operation to display a window pattern as shown in the diagram of FIG. 9C. As a typical countermeasure against the horizontal-direction crosstalk, for example, it is necessary to get rid of current decreases due to voltage drops. In general, the level of recognition of differences in luminance is equal to or lower than 1%. Thus, a countermeasure needs to be taken against the horizontal-direction crosstalk so as to satisfy the condition for the level of recognition of differences in luminance.

In addition, the state in which the cathode electric potential is floated over the ground electric potential GND due to the total driving current Ids_all varies in accordance with the driving current Ids, that is, in accordance with the gradation. Thus, the characteristic undesirably also varies from gradation to gradation as well. As a result, in the case of a color display, it is feared that a color phase shift exists.

The following description explains a mechanism provided in accordance with an embodiment to serve as a mechanism for solving a variety of problems described above.

<Basic Principle>

FIG. 10 is an explanatory conceptual diagram referred to in description of a mechanism provided in accordance with embodiments to serve as a mechanism for repressing display irregularities caused by voltage drops at a plurality of points along the power-supply providing line 105DSL. The embodiments are the first to third embodiments described later.

The basic concept of the mechanism according to the embodiment underlies a layout method for adjusting the length and/or width of a draw wire 121DL which is also referred to as a drain wire which is connecting the drain electrode of the driving transistor 121 employed in each pixel circuit P to the power-supply providing line 105DSL. As mentioned previously, the drain electrode of the driving transistor 121 is also referred to as the power-supply providing terminal of the driving transistor 121. In accordance with the layout method, at least one of the length and width of the draw wire 121DL are adjusted for each of the pixel circuits P so that the electric potentials each appearing on the drain electrode (that is, the power-supply providing terminal) of the driving transistor 121 employed in one of the pixel circuits P are uniform for the pixel circuits P under a condition of driving the organic EL device 127 employed in each of pixel circuits P laid out in the longitudinal direction of the power-supply providing line 105DSL to emit light with a uniform luminance. Thus, the electric potentials each appearing on the drain electrode (that is, the power-supply providing terminal) of the driving transistor 121 employed in one of the pixel circuits P are made extremely uniform for the pixel circuits P in order to drive the organic EL device 127 employed in each of the pixel circuits P to emit light with a uniform luminance. As a result, it is possible to get rid of luminance irregularities caused by voltage drops at a plurality of points along the power-supply providing line 105DSL to appear as irregularities such as shading and crosstalk.

To put it concretely, first of all, the power-supply providing line 105DSL is laid out as a line having portions made as thick as possible as a prerequisite. The portions made as thick as possible do not include portions crossing other wires because it is difficult to make the portions crossing other wires thick. By making the portions except the portions crossing other wires as thick as possible, it is possible to much reduce voltage drops caused by the wire resistance of the power-supply providing line 105DSL itself. On top of that, the length and/or width of the draw wire 121DL are adjusted for each of the pixel circuits P laid out in the longitudinal direction of the power-supply providing line 105DSL so that the sum of the wire resistance of the draw wire 121DL provided for any specific one of the pixel circuits P and the wire resistance of the power-supply providing line 105DSL connecting the specific pixel circuit P to the driving scanning section 105 becomes uniform for all the pixel circuits P. That is to say, the varying voltage drops at a plurality of points along the power-supply providing line 105DSL can be compensated for by the varying wire resistances of the draw wires 121DL.

Basically, the wire resistance of the draw wire 121DL provided for a pixel circuit P separated away from the driving scanning section 105 serving as a source generating the power-supply driving pulse DSL (or the power-supply voltage having a pulse shape) by a short longitudinal direction distance is made relatively large whereas the wire resistance of the draw wire 121DL provided for a pixel circuit P separated away from the driving scanning section 105 serving as a source generating the power-supply driving pulse DSL by a long longitudinal direction distance is made relatively small. The longitudinal direction distance is a distance in the longitudinal direction of the power-supply providing line 105DSL. By setting the wire resistance of the draw wire 121DL provided for the pixel circuit P at such a value that, the longer (or shorter) the longitudinal direction distance between the driving scanning section 105 and the pixel circuit P, the smaller (or larger) the wire resistance, the varying voltage drops at a plurality of points along the power-supply providing line 105DSL in the display panel section 100 can be compensated for by the varying wire resistances of the draw wires 121DL. Thus, the generation of the shading and/or the crosstalk can be avoided. As a result, it is possible to implement a display apparatus having a good image quality.

FIG. 10 is a block diagram showing a typical configuration including a matrix of pixel circuits P embedded in the pixel array section 102 as a pixel matrix having two horizontal-direction pixel rows and three vertical-direction pixel columns. As shown in the block diagram of FIG. 10, pixel circuits P1, P2 and P3 are provided on the first pixel row. The pixel circuit P1 is a pixel matrix P on the side close to the driving scanning section 105, the pixel circuit P2 is a pixel matrix P at the middle of the pixel row and the pixel circuit P3 is a pixel circuit P on the side close to the right edge of the display panel section 100. By the same token, pixel circuits P4, P5 and P6 are provided on the second pixel row. The pixel circuit P4 is a pixel matrix P on the side close to the driving scanning section 105, the pixel circuit P5 is a pixel matrix P at the middle of the pixel row and the pixel circuit P6 is a pixel circuit P on the side close to the right edge of the display panel section 100.

In the typical configuration shown in the block diagram of FIG. 10, reference notation r denotes the wire resistance exhibited by the power-supply providing line 105DSL as a wire resistance per length unit corresponding to one pixel circuit P. On the other hand, reference notation R denotes the wire resistance of the draw wire 121DL connecting the drain electrode of the driving transistor 121 employed in every pixel circuit P to the power-supply providing line 105DSL. More particularly, each of reference notations R1, R2, R3, R4, R5 and R6 shown in the block diagram of FIG. 10 denotes the wire resistance of the draw wire 121DL connecting the drain electrode of the driving transistor 121 employed in one of the pixel circuits P1, P2, P3, P4, P5 and P6 respectively. A suffix is attached to reference notation R to serve as a suffix matching a suffix attached to reference notation P denoting a pixel circuit including the draw wire 121DL with a wire resistance denoted by reference notation R.

In an operation to show an all white display on the screen, basically, a driving current Ids (=I) uniform for all pixel circuits P flows through each driving transistor 121. Since the driving current I is generated by the driving scanning section 105 and flows to the driving transistor 121 in any pixel circuit P through the power-supply providing line 105DSL and the draw wire 121DL provided for the driving transistor 121, an electric potential appearing on the drain electrode of the driving transistor 121 decreases by a voltage drop caused by the resistances of the power-supply providing line 105DSL and the draw wire 121DL. Let each of reference notations V1, V2, V3, V4, V5 and V6 shown in the block diagram of FIG. 10 denote the electric potential appearing on the drain electrode of the driving transistor 121 employed in one of the pixel circuits P1, P2, P3, P4, P5 and P6 respectively. A suffix is attached to reference notation V to serve as a suffix matching a suffix attached to reference notation P denoting a pixel circuit including the driving transistor 121 having the drain electrode on which the electric potential denoted by reference notation V appears.

Let each of reference notations $\Delta V1$, $\Delta V2$, $\Delta V3$, $\Delta V41$, $\Delta V5$ and $\Delta V6$ denote respectively a voltage drop from a voltage appearing at the output terminal of the driving scanning section 105 to one of the electric potentials V1, V2, V3, V4, V5 and V6 appearing on the drain electrode of a driving transistor 121. In this case, the voltage drops $\Delta V1$, $\Delta V2$, $\Delta V3$, $\Delta V4$, $\Delta V5$ and $\Delta V6$ can be expressed by Eqs. (3) as follows:

$$\Delta V1 = r \times 3I + R1 \times I$$
$$\Delta V2 = r \times 3I + r \times 2I + R2 \times I$$
$$\Delta V3 = r \times 3I + r \times 2I + r \times I + R3 \times I$$
$$\Delta V4 = r \times 3I + R4 \times I$$
$$\Delta V5 = r \times 3I + r \times 2I + R5 \times I$$
$$\Delta V6 = r \times 3I + r \times 2I + r \times I + R6 \times I \quad (3)$$

Even if the voltage appearing at the output terminal of the driving scanning section 105 drops to the electric potentials V1, V2, V3, V4, V5 and V6 appearing on the drain electrodes of the driving transistors 121, no display irregularities are generated on the screen provided that the voltage drops are uniform for all the driving transistors 121. The mechanism according to the embodiment is designed by paying attention to the fact that no display irregularities are generated on the screen provided that the voltage drops from the voltage appearing at the output terminal of the driving scanning section 105 to the electric potentials V1, V2, V3, V4, V5 and V6 appearing on the drain electrodes of the driving transistors 121 are uniform for all the driving transistors 121. If the voltage drops from the voltage appearing at the output terminal of the driving scanning section 105 to the electric potentials V1, V2, V3, V4, V5 and V6 appearing on the drain electrodes of the driving transistors 121 are uniform for all the driving transistors 121, Eqs. (4) can be derived from Eqs. (3) as follows:

$$r \times 3I + R1 \times I = r \times 3I + r \times 2I + R2 \times I \quad (4)$$
$$= r \times 3I + r \times 2I + r \times I + R3 \times I$$
$$= r \times 3I + R4 \times I$$
$$= r \times 3I + r \times 2I + R5 \times I$$
$$= r \times 3I + r \times 2I + r \times I + R6 \times I$$

The wire resistance R of the draw wire 121DL also referred to as a drain wire provided for each pixel circuit P is adjusted so that Eqs. (4) are satisfied. That is to say, the values of the wire resistances R1, R2, R3, R4, R5 and R6 are found by solving Eqs. (4). The wire resistances R1, R2, R3, R4, R5 and R6 satisfying Eqs. (4) provide an electric potential V appearing on the drain electrode of the driving transistor 121 employed in each pixel circuit P as an electric potential V uniform for all the pixel circuits P as expressed by the following equations:

$$V1 = V2 = V3 = V4 = V5 = V6$$

The wire resistance R of the draw wire 121DL is adjusted for each of the pixel circuits P arranged in the longitudinal direction of the power-supply providing line 105DSL by properly changing the length and/or width of the draw wire 121DL.

To put it concretely, the wire resistance R of the draw wire 121DL connecting the drain electrode of the driving transistor 121 employed in a pixel circuit P close to the driving scanning section 105 to the power-supply providing line 105DSL is increased by reducing the width of the draw wire 121DL and/or increasing the length of the draw wire 121DL. On the other hand, the wire resistance R of the draw wire 121DL connecting the drain electrode of the driving transistor 121 employed in a pixel circuit P far away from the driving scanning section 105 to the power-supply providing line 105DSL is decreased by increasing the width of the draw wire 121DL and/or reducing the length of the draw wire 121DL. Such draw wires 121DL are laid out in the pixel array section 102 so as to provide an electric potential V appearing on the drain electrode of the driving transistor 121 employed in each pixel circuit P as an electric potential V uniform for all the pixel circuits P.

By adjusting the length and/or width of the draw wire 121DL provided in every pixel circuit P and laying out such draw wires 121DL in the pixel array section 102, it is possible to provide an electric potential V appearing on the drain electrode of the driving transistor 121 employed in each pixel circuit P as an electric potential V uniform for all the pixel circuits P. As explained before, the drain electrode of a driving transistor 121 serves as the power-supply providing terminal of the driving transistor 121. Even if the voltage appearing at the output terminal of the driving scanning section 105 drops to the electric potentials V1, V2, V3, V4, V5 and V6 appearing on the drain electrodes of the driving transistors 121 due to the driving current Ids flowing through the power-supply providing line 105DSL and draw wires 121DL, no display irregularities are generated on the screen provided that the voltage drops are uniform for all the driving transistors 121.

<First Embodiment>

Figure 11A:
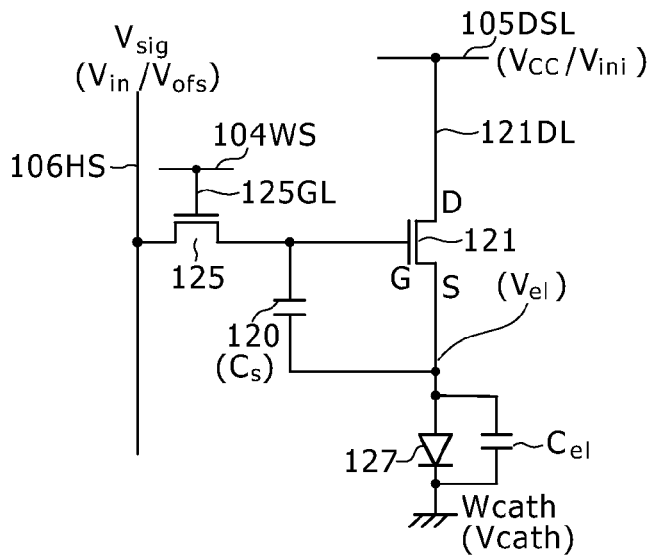
FIG. 11A is a circuit diagram showing a pixel circuit according to the embodiments and a typical comparison example for the pixel circuit.
Figure 11B:
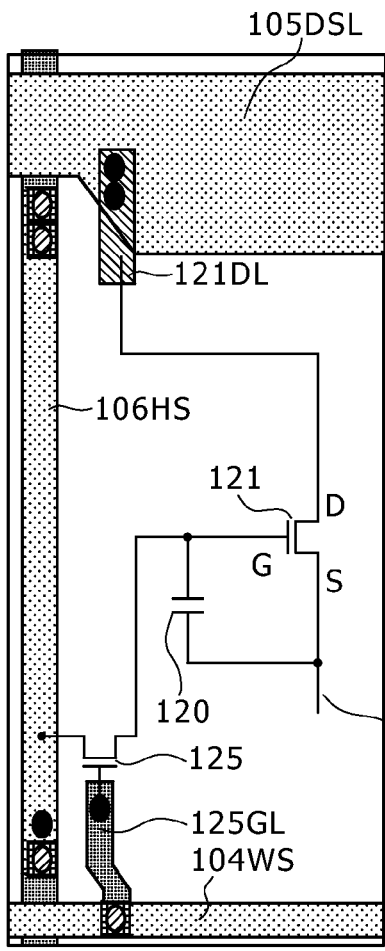
FIG. 11B is a diagram showing a pixel-component layout of a typical comparison example for the pixel circuit.
Figure 12:
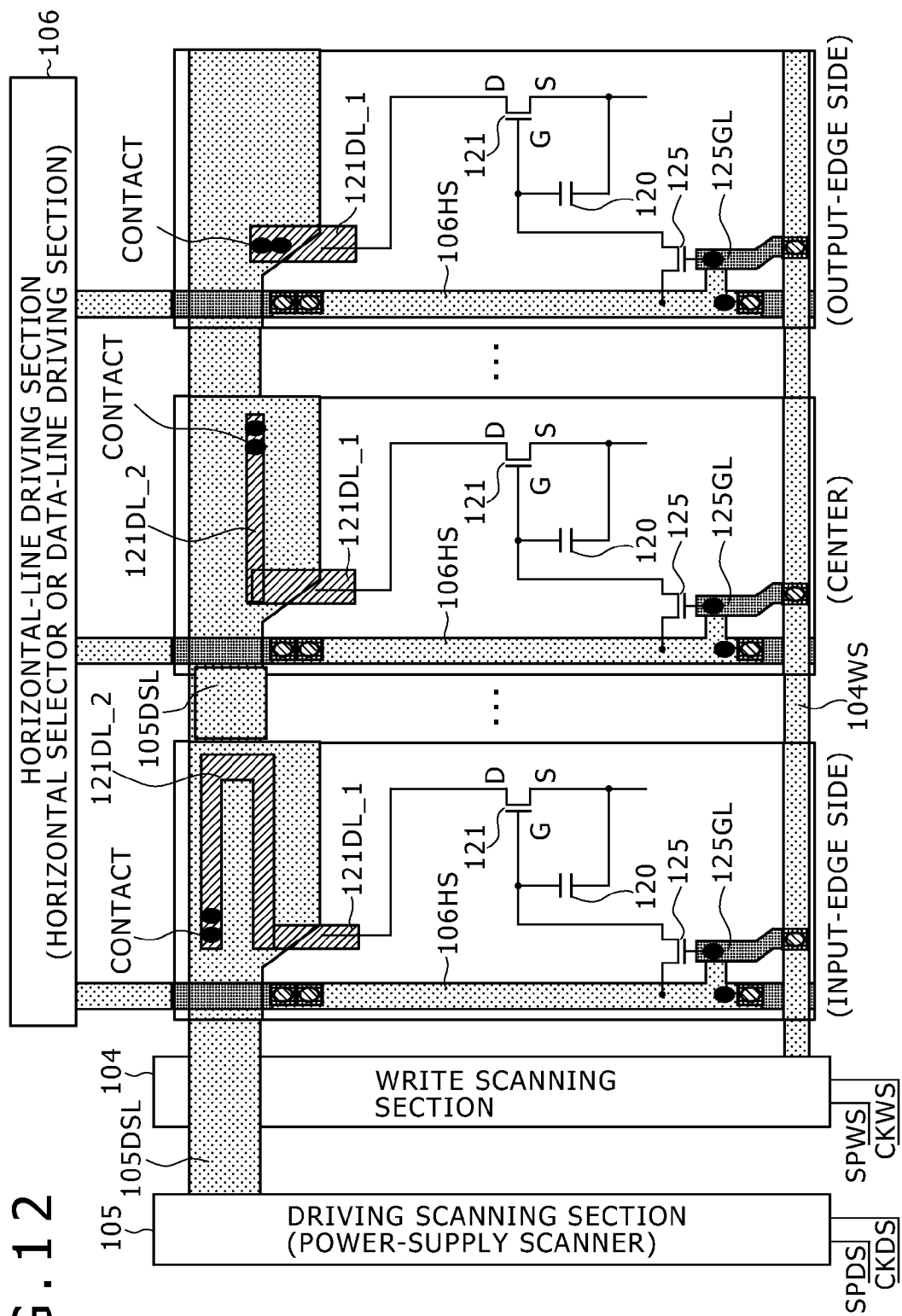
FIG. 12 is an explanatory diagram serving as a model diagram to be referred to in description of a typical layout according to the first embodiment implementing the basic principle explained earlier by referring to the diagram of FIG. 10 by changing the length of a second draw wire in each pixel circuit.

Each of FIGS. 11A, 11B, 12, 13A and 13B is an explanatory diagram serving as a model diagram referred to in description of a typical layout according to a first embodiment implementing the basic principle explained earlier by referring to the diagram of FIG. 10. To be more specific, FIGS. 11A and 11B are diagrams each serving as a model diagram referred to in description of a typical layout according to none of first to third embodiments to be described later. On the other hand, FIG. 12 is a diagram serving as a model diagram referred to in description of a typical layout according to the first embodiment. It is to be noted that, since a relation between the power-supply providing line 105DSL and the draw wire 121DL is a relation of most importance to the mechanism according to the embodiments, other portions are displayed in a simple manner by showing a pixel circuit P. The complete configuration of the pixel circuit P is also shown in a circuit diagram of FIG. 11A for the sake of clarity.

At any rate, in order to reduce the resistances of the write scanning line 104WS, the power-supply providing line 105DSL and the video-signal line 106HS, each of the write scanning line 104WS, the power-supply providing line 105DSL and the video-signal line 106HS is made from a low-resistivity material such as aluminum or tungsten and implemented on an second wiring layer L2. It is to be noted that a first wiring layer L1 also provided for the video-signal line 106HS made of a different material such as molybdenum having a relatively larger resistance overlaps an intersection of the video-signal line 106HS and the write scanning line 104WS as well as an intersection of the video-signal line 106HS and the power-supply providing line 105DSL. In the typical layout shown in the diagram of FIG. 11B, at each of an intersection of the video-signal line 106HS and the write scanning line 104WS and an intersection of the video-signal line 106HS and the power-supply providing line 105DSL, a portion of the video-signal line 106HS is made to pass through the first wiring layer L1 provided for the intersection.

A draw line connecting a terminal of a transistor to a scanning line is typically implemented on the first wiring layer L1 or the second wiring layer L2 or implemented on a layer other than the first wiring layer L1 or the second wiring layer L2. For example, in the typical comparison layout shown in the diagram of FIG. 11B, a gate draw wire 125GL made from the same material as the video-signal line 106HS implemented on the first wiring layer L1 is used for connecting the gate electrode of the sampling transistor 125 to the write scanning line 104WS. The gate draw wire 125GL is also referred to merely as a gate line. On the other hand, the draw wire 121DL implemented on a third wiring layer L3 is used for connecting the drain electrode of the driving transistor 121 to the power-supply providing line 105DSL. The draw wire 121DL implemented on third wiring layer L3 is made of a material different from the materials used for making the write scanning line 104WS, the power-supply providing line 105DSL and the video-signal line 106HS on the first wiring layer L1 and the second wiring layer L2. The material used for making the draw wire 121DL on the third wiring layer L3 has a large resistivity in comparison with the material used for making the write scanning line 104WS, the power-supply providing line 105DSL and the video-signal line 106HS on the second wiring layer L2. That is to say, for the same width, the same length and the same thickness, the draw wire 121DL implemented on the third wiring layer L3 has a high resistance in comparison with the second wiring layer L2. A poly-silicon layer is a typical example of the material for making the draw wire 121DL implemented on the third wiring layer L3.

In the typical comparison layout shown in the diagram of FIG. 11B, the draw wire 121DL is connected to the power-supply providing line 105DSL in a simple manner. The wire shape of the draw wire 121DL is uniform for all pixel circuits P. That is to say, the draw wire 121DL has a layout uniform for all pixel circuits P.

In a layout according to the first embodiment shown in the diagram of FIG. 12, on the other hand, the resistance of the draw wire 121DL on each pixel circuit P close to the driving scanning section 105 is made relatively large whereas the resistance of the draw wire 121DL on each pixel circuit P far away from the driving scanning section 105 is made relatively small. As shown in the diagram of FIG. 10, pixel circuits P close to the driving scanning section 105 are pixel circuits P1 and P4 whereas pixel circuits P far away from the driving scanning section 105 are pixel circuits P3 and P6.

That is to say, the length of the draw wire 121DL on any pixel circuit P is set at such a value that, the longer the distance between the driving scanning section 105 and the pixel circuit P, the smaller the resistance of the draw wire 121DL. To put it concretely, in the layout according to the first embodiment shown in the diagram of FIG. 12, the draw wire 121DL includes a first draw wire 121DL_1 connected to the drain electrode of the driving transistor 121 and a second draw wire 121DL_2 connected to the power-supply providing line 105DSL. The first draw wire 121DL_1 on the drain side is made all but identical with that of the typical comparison layout shown in the diagram of FIG. 11B. However, the first draw wire 121DL_1 is extended by the second draw wire 121DL_2 used as an extension wire to contacts on the power-supply providing line 105DSL and the length of the second draw wire 121DL_2 is adjusted in accordance with the location of a pixel circuit P including the first draw wire 121DL_1. In this way, the length of the entire draw wire 121DL on any pixel circuit P close to the driving scanning section 105 or close to the input edge side is made relatively large whereas the length of the entire draw wire 121DL on any pixel circuit P far away from the driving scanning section 105 or far away from the input edge side is made relatively small. That is to say, the length of the entire draw wire 121DL on any pixel circuit P is adjusted so that, the longer the distance between the driving scanning section 105 and the pixel circuit P, the smaller the length of the entire draw wire 121DL. By the way, on the pixel circuit P farthest from the driving scanning section 105, that is, the pixel circuit P on the output edge side of the right edge side of the display panel section 100, the second draw wire 121DL_2 is not used as an extension line in order to make the length of the entire draw wire 121DL smallest.

The draw wire 121DL including the first draw wire 121DL_1 and the second draw wire 121DL_2 is implemented on the third wiring layer L3 parallel to the second wiring layer L2 implementing the power-supply providing line 105DSL separately from the power-supply providing line 105DSL. As described before, draw wire 121DL implemented on third wiring layer L3 is made of a material such as poly-silicon. By implementing the draw wire 121DL in this way, the draw wire 121DL by no means serves as a barrier to the layouts of other wires. Then, after finding the resistance R of the draw wire 121DL in accordance with Eqs. (4) in order to determine the length of the second draw wire 121DL_2 for every pixel circuit P, every second draw wire 121DL_2 is connected to the contacts cited before. In the case of a pixel circuit P having no second draw wire 121DL_2, the first draw wire 121DL_1 is connected directly to the contacts.

In addition, the draw wire 121DL is implemented on the third wiring layer L3 and made of a wire material having a large resistivity in comparison with the material for making the second wiring layer L2 which implements the power-supply providing line 105DSL. Thus, the process of finding the resistance R of the draw wire 121DL in accordance with Eqs. (4) in order to determine the length of the second draw wire 121DL_2 for every pixel circuit P is easy to carry out.

<Second Embodiment>

FIG. 13A is an explanatory diagram serving as a model diagram referred to in description of a typical layout according to a second embodiment implementing the basic principle explained earlier by referring to the diagram of FIG. 10. In an implemented mechanism shown in the diagram of FIG. 10, the resistance of the draw wire 121DL on each pixel circuit P close to the driving scanning section 105 is made relatively large whereas the resistance of the draw wire 121DL on each pixel circuit P far away from the driving scanning section 105 is made relatively small. As shown in the diagram of FIG. 10, pixel circuits P close to the driving scanning section 105 are pixel circuits P1 and P4 whereas pixel circuits P far away from the driving scanning section 105 are pixel circuits P3 and P6.

That is to say, the width of the draw wire 121DL on any pixel circuit P is determined for every pixel circuit P so that, the longer the distance from the driving scanning section 105 to a pixel circuit P, the larger the value at which the width of the draw wire 121DL provided for the pixel circuit P is set. To put it concretely, in a layout according to the second embodiment, instead of adjusting the length of the second draw wire 121DL_2, the width of the draw wire 121DL on each pixel circuit P close to the driving scanning section 105 is set at a relatively small value whereas the width of the draw wire 121DL on each pixel circuit P far away from the driving scanning section 105 is set at a relatively large value.

The draw wire 121DL is implemented on the third wiring layer L3 parallel to the second wiring layer L2 implementing the power-supply providing line 105DSL separately from the power-supply providing line 105DSL. As described before, draw wire 121DL implemented on third wiring layer L3 is made of a material such as poly-silicon. By implementing the draw wire 121DL in this way, the draw wire 121DL by no means serves as a barrier to the layouts of other wires.

By the way, on a pixel circuit P far away from the driving scanning section 105, the number of contacts connected to the draw wire 121DL can be raised to a value proper for the increased width of the draw wire 121DL. As an alternative, the number of contacts connected to the draw wire 121DL can be made uniform for all pixel circuits P.

<Third Embodiment>

FIG. 13B is an explanatory diagram serving as a model diagram referred to in description of a typical layout according to a third embodiment implementing the basic principle explained earlier by referring to the diagram of FIG. 10. In an implemented mechanism shown in the diagram of FIG. 10, the resistance of the draw wire 121DL on each pixel circuit P close to the driving scanning section 105 is made relatively large whereas the resistance of the draw wire 121DL on each pixel circuit P far away from the driving scanning section 105 is made relatively small. As shown in the diagram of FIG. 10, pixel circuits P close to the driving scanning section 105 are pixel circuits P1 and P4 whereas pixel circuits P far away from the driving scanning section 105 are pixel circuits P3 and P6.

That is to say, the length and width of the draw wire 121DL on any pixel circuit P are determined for every pixel circuit P so that, the longer the distance from the driving scanning section 105 to a pixel circuit P, the smaller the value at which the length of the draw wire 121DL provided for the pixel circuit P is set and the larger the value at which the width of the draw wire 121DL provided for the pixel circuit P is set. To put it concretely, in a layout according to the third embodiment obtained by combining the first and second embodiments, the length of the draw wire 121DL on each pixel circuit P close to the driving scanning section 105 is set at a relatively large value whereas the width of the draw wire 121DL on each pixel circuit P close to the driving scanning section 105 is set at a relatively small value. On the other hand, the length of the draw wire 121DL on each pixel circuit P far away from the driving scanning section 105 is set at a relatively small value whereas the width of the draw wire 121DL on each pixel circuit P far away from the driving scanning section 105 is set at a relatively large value.

In the same way as the first embodiment, the draw wire 121DL including the first draw wire 121DL_1 and the second draw wire 121DL_2 is implemented on the third wiring layer L3 parallel to the second wiring layer L2 implementing the power-supply providing line 105DSL separately from the power-supply providing line 105DSL. As described before, the draw wire 121DL implemented on third wiring layer L3 is made of a material such as poly-silicon. By implementing the draw wire 121DL in this way, each of the first draw wire 121DL_1 and the second draw wire 121DL_2 by no means serves as a barrier to the layouts of other wires.

By adjusting both the length and width of the second draw wire 121DL_2 in accordance with the third embodiment as described above, the range of the resistance of the draw wire 121DL becomes wider than the ranges each provided by the first or second embodiment as the range of the resistance of the draw wire 121DL.

By designing a pixel layout in accordance with any one of the first to third embodiments as described above, it is possible to repress the shading phenomenon shown in the diagram of FIG. 8 and the crosstalk phenomenon shown in the diagram of FIG. 9C. The shading and crosstalk phenomena are caused by voltage drops at a plurality of points along the power-supply providing line 105DSL, becoming a problem raised by the typical comparison pixel layout shown in the diagrams of FIGS. 11A and 11B. Thus, in a display apparatus employing pixel circuits each having a current-driven-emission light emitting device such as the organic EL device 127, the shading and crosstalk phenomena can be repressed. As a result, a good image quality can be obtained.

The present application contains subject matter related to that disclosed in Japanese Priority Patent Application JP 2008-106456 filed in the Japan Patent Office on Apr. 16, 2008, the entire content of which is hereby incorporated by reference.

It should be understood by those skilled in the art that various modifications, combinations, sub-combinations and alterations may occur depending on design requirements and other factor in so far as they are within the scope of the appended claims or the equivalents thereof.

What is claimed is:

1. A display apparatus comprising:
a pixel array section comprising:
a plurality of pixel circuits arranged in a matrix and including a first pixel circuit and a second pixel circuit, the first pixel circuit including a first driving transistor and a first electro-optical device, the second pixel circuit including a second driving transistor and a second electro-optical device; and
draw wires including a first draw wire for the first pixel circuit and a second draw wire for the second pixel circuit, wherein
the first draw wire is provided in said first pixel circuit to connect said first driving transistor to a power supply line via a first contact area,
the second draw wire is provided in said second pixel circuit to connect said second driving transistor to said power supply line via a second contact area,
the first pixel circuit is located closer to a source applying a power-supply voltage to said power supply line than the second pixel circuit, and
a size of the first contact area is larger than a size of the second contact area.

2. The display apparatus according to claim 1 wherein the resistance of the first draw wire is larger than the resistance of the second draw wire because of a difference between at least one of the length or the width of the first draw wire as compared to at least one of the length or width of the second draw wire.

3. The display apparatus according to claim 2 wherein at least one of the length or width of said first and second draw wires are respectively varied for respective pixel circuits so that an electric potential appearing on power-supply providing terminals of said first and second driving transistors becomes uniform for said first and second pixel circuits under a condition of driving said first and second electro-optical devices.

4. The display apparatus according to claim 2 wherein:
said first and second draw wires are created on a draw-wire wiring layer separated away from a power-supply wiring layer of said power-supply line; and
a wire portion included in respective ones of said draw wires, the length or the width of which is varied in accordance with the location of said pixel circuit including said draw line, is implemented on said draw-wire wiring layer parallel to said power-supply wiring layer of said power supply line.

5. The display apparatus according to claim 1 wherein a wire material used for making said draw wires has a resistivity greater than the resistivity of a wire material used for making said power supply line.

6. The display apparatus according to claim 1, further comprising a driving-signal stabilization circuit for stabilizing a driving current generated by said driving transistor.

7. The display apparatus according to claim 6 wherein
at least said first and second pixel circuits respectively have
first and second sampling transistors for respectively passing a video signal to first and second signal holding capacitors corresponding to said first and second driving transistors with a timing determined in advance, and
for at least said first pixel circuit, said driving-signal stabilization circuit is configured to:
supply said video signal to said first sampling transistor by switching the electric potential of said video signal from a reference electric potential to a signal electric potential and vice versa; and
carry out a threshold-voltage compensation function to hold a voltage corresponding to the threshold voltage of said first driving transistor in said first signal holding capacitor by putting said first sampling transistor in a turned-on state during a time band in which a voltage corresponding to a first electric potential used for causing a driving current to flow to said first electro-optical device is being applied to a power-supply providing terminal of said first driving transistor whereas said reference electric potential of said video signal is being applied to said first sampling transistor.

8. The display apparatus according to claim 6 wherein
at least said first and second pixel circuits respectively have
first and second sampling transistors for respectively passing a video signal to first and second signal holding capacitors corresponding to said first and second driving transistors, and
for at least said first pixel circuit, said driving-signal stabilization circuit is configured to carry out:
a threshold-voltage compensation function to hold a voltage corresponding to the threshold voltage of said first driving transistor in said first signal holding capacitor; and
a mobility compensation function to add a compensation voltage corresponding to the mobility of said first driving transistor to a signal to be stored in said first signal holding capacitor in an operation to store said signal amplitude into said first signal holding capacitor as video information by putting said first sampling transistor in a turned-on state after completion of execution of said threshold-voltage compensation function.

9. The display apparatus according to claim 6 wherein
at least said first and second pixel circuits respectively have
first and second signal holding capacitors, and
for at least said first pixel circuit, said driving-signal stabilization circuit is configured to carry out a bootstrap function based on a coupling effect of said first signal holding capacitor which is connected between a control input terminal of said first driving transistor and a driving-current output terminal of said first driving transistor.

* * * * *